US012644732B2

(12) United States Patent
Lee et al.

(10) Patent No.: US 12,644,732 B2
(45) Date of Patent: Jun. 2, 2026

(54) SENSOR BALL AND HOME APPLIANCE SYSTEM HAVING SAME

(71) Applicant: LG ELECTRONICS INC., Seoul (KR)

(72) Inventors: Byoungjoo Lee, Seoul (KR); Sinchul Jung, Seoul (KR); Yingli Han, Seoul (KR); Jingyeong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 266 days.

(21) Appl. No.: 18/289,658

(22) PCT Filed: May 6, 2022

(86) PCT No.: PCT/KR2022/006486
§ 371 (c)(1),
(2) Date: Nov. 6, 2023

(87) PCT Pub. No.: WO2022/235110
PCT Pub. Date: Nov. 10, 2022

(65) Prior Publication Data
US 2024/0255322 A1     Aug. 1, 2024

(30) Foreign Application Priority Data
May 7, 2021     (KR) ........................ 10-2021-0059188

(51) Int. Cl.
*G01D 11/24*          (2006.01)
*G01D 21/02*          (2006.01)
(Continued)

(52) U.S. Cl.
CPC ........... *G01D 11/245* (2013.01); *G01D 21/02* (2013.01); *H04W 4/38* (2018.02); *H05K 1/144* (2013.01);
(Continued)

(58) Field of Classification Search
CPC ....... G01D 11/245; G01D 21/02; H04W 4/38; H05K 1/144
See application file for complete search history.

(56) References Cited

U.S. PATENT DOCUMENTS 10,278,592 B2 *  5/2019  Fish ......................... A61B 5/33
2010/0020550 A1 *  1/2010  Kawashima ....... H05B 41/3922
362/362

(Continued)

FOREIGN PATENT DOCUMENTS

CN          206152229 U  *  5/2017
KR    10-2015-0067002 A      6/2015
(Continued)

*Primary Examiner* — Jamel E Williams
(74) *Attorney, Agent, or Firm* — Birch, Stewart, Kolasch & Birch, LLP

(57)          ABSTRACT

The present disclosure relates to a sensor ball and a home appliance system having the same. According to one embodiment of the present disclosure, there is provided a sensor ball including a case having at least some curved surfaces, a first board disposed within the case and on which a processor is disposed, and a second board electrically connected to the first board and on which a plurality of sensors are disposed, in which some of the plurality of sensors are disposed on an outer surface of the case or one end of the second board, and the other of the plurality of sensors protrudes from the outer surface of the case or one end of the second board. Accordingly, it is possible to stably sense information from various home appliances using the plurality of sensors.

16 Claims, 15 Drawing Sheets

(51) Int. Cl.
   *H04W 4/38*       (2018.01)
   *H05K 1/14*       (2006.01)

(52) U.S. Cl.
   CPC ................. *H05K 2201/042* (2013.01); *H05K 2201/09754* (2013.01); *H05K 2201/10151* (2013.01)

(56)          References Cited

U.S. PATENT DOCUMENTS

| | | | |
|---|---|---|---|
| 2016/0305797 A1* | 10/2016 | Pietrasik | ................. H04W 4/80 |
| 2017/0067201 A1 | 3/2017 | Jeon et al. | |
| 2022/0176206 A1* | 6/2022 | Behunin | ............ A63B 37/0012 |

FOREIGN PATENT DOCUMENTS

| | | | | |
|---|---|---|---|---|
| KR | 20150067002 A | * | 6/2015 | .......... A61B 5/0002 |
| KR | 10-2016-0039872 A | | 4/2016 | |
| KR | 10-2019-0107605 A | | 9/2019 | |
| KR | 10-2020-0135122 A | | 12/2020 | |

\* cited by examiner

SENSOR BALL AND HOME APPLIANCE SYSTEM HAVING SAME

CROSS REFERENCE TO RELATED APPLICATIONS

This application is the National Phase of PCT International Application No. PCT/KR2022/006486, filed on May 6, 2022, which claims priority under 35 U.S.C. 119 (a) to Patent Application No. 10-2021-0059188, filed in the Republic of Korea on May 7, 2021, all of which are hereby expressly incorporated by reference into the present application.

BACKGROUND

1. Field

The present disclosure relates to a sensor ball and a home appliance system having the same, and more specifically, to a sensor ball that can stably sense information from various home appliances using a plurality of sensors and a home appliance system having the same.

2. Description of the Related Art

Home appliances may be electrical appliances used in the home, such as washing machines, refrigerators, and air conditioners.

As functions of home appliances become more sophisticated, there is a trend to acquire various sensor data of home appliances and drive them based on the acquired sensor data.

Meanwhile, other than sensors disposed in case in which manufacturing home appliances, it is difficult to install additional necessary sensors, and thus, there is a disadvantage that it is difficult to upgrade the functionality of home appliances in practice.

SUMMARY

An object of the present disclosure is to provide a sensor ball capable of reliably sensing information from various home appliances using a plurality of sensors and a home appliance system having the same.

Meanwhile, another purpose of the present disclosure is to provide a sensor ball capable of changing a sensing sensor depending on a type of home appliance and a home appliance system having the same.

Meanwhile, still another purpose of the present disclosure is to provide a sensor ball capable of changing and transmitting sensor data depending on the type of home appliance and a home appliance system having the same.

In order to achieve the objects, according to one embodiment of the present disclosure, there are provided a sensor ball and a home appliance system having the same including: a case having at least some curved surfaces; a first board disposed within the case and on which a processor is disposed; and a second board electrically connected to the first board and on which a plurality of sensors are disposed, in which some of the plurality of sensors are disposed on an outer surface of the case or one end of the second board, and the other of the plurality of sensors protrudes from the outer surface of the case or one end of the second board.

Some of the plurality of sensors may include a spectrometric sensor, an acceleration sensor, and a gyro sensor, and the other of the plurality of sensor may include a turbidity sensor and a humidity sensor.

The other of the plurality of sensors may further include a biosensor.

The other of the plurality of sensors may include a turbidity sensor and a humidity sensor, and the turbidity sensor may further protrude based on the outer surface of the case or one end portion of the second board than the humidity sensor.

The second board may be detached from or attached to a groove in the case.

In case in which the second board is attached to the groove in the case, a connector formed in the other end portion of the second board may be electrically connected to a connector of the first board by a spring formed in the groove in the case.

The sensor ball and the home appliance system having the same according to one embodiment of the present disclosure may further include a third board attached in place of the second board and electrically connected to the first board and in which a plurality of sensors disposed, in case in which the second board is detached from the groove in the case.

The third board may protrude further out of the case than the second board.

The number of sensors disposed on the third board may be greater than the number of sensors disposed on the second board.

A width of a connector of the second board and a width of a connector of the third board may be the same, and a size of an area where the plurality of sensors are disposed on the third board may be larger than a size of an area where the plurality of sensors are disposed on the second board.

The plurality of sensors disposed on the third board may protrude from the outer surface of the case.

The plurality of sensors disposed on the third board may include a spectrometric sensor, an acceleration sensor, a gyro sensor, a dust sensor, a gas sensor, and a humidity sensor.

The plurality of sensors disposed on the third board may further include a biosensor.

The first board may further include a communication module configured to perform wireless communication with a home appliance, and the communication module may perform pairing with the home appliance based on strength of a received RF signal, and transmit sensor data sensed by the plurality of sensors to the paired home appliance.

The first board may further include a communication module configured to perform wireless communication with a home appliance, and the communication module may perform pairing with the home appliance based on n strength of a received RF signal in case in which a connection button is pressed for a predetermined time or more, and may transmit sensor data required for the paired home appliance among sensor data sensed from a plurality of sensors.

The communication module may transmit, in case in which the paired home appliance is a washing machine, sensor data sensed from a spectrometric sensor, a turbidity sensor, an acceleration sensor, and a gyro sensor to the washing machine, in case in which the paired home appliance is a dryer, transmit the sensor data sensed from the spectrometric sensor, the turbidity sensor, the acceleration sensor, the gyro sensor, and the humidity sensor to the dryer, and in case in which the paired home appliance is a dishwasher, the sensor data sensed from the spectrometric sensor, the turbidity sensor, and the humidity sensor to the dishwasher.

The first board may further include a communication module configured to perform wireless communication with a home appliance, and the communication module transmits, in case in which the paired home appliance is a clothing manager, sensor data sensed from a spectrometric sensor, an acceleration sensor, a gyro sensor, a humidity sensor, and a dust sensor to the clothing manager, in case in which the paired home appliance is an air purifier, sensor data sensed from a gas sensor and the dust sensor to the air purifier, and, in case in which the paired home appliance is a refrigerator, the sensor data sensed from the gas sensor and the humidity sensor to the refrigerator.

The first board may further include a communication module configured to perform wireless communication with a home appliance, and the communication module may perform pairing with a plurality of home appliances, and transmit sensor data required for each of the plurality of paired home appliances among the sensor data sensed by the plurality of sensors.

In a state where the processor is paired with a washing machine, the processor determines laundry tangles based on sensor data sensed by an acceleration sensor and a gyro sensor, and transmits determined laundry tangle information to the washing machine.

In order to achieve the objects, according to another embodiment of the present disclosure, there are provided a sensor ball and a home appliance system having the same including: a case having at least some curved surfaces; a first board disposed within the case and on which a processor is disposed; a second board electrically connected to the first board and on which a plurality of sensors are disposed; and a third board attached in place of the second board and electrically connected to the first board and in which a plurality of sensors disposed, in case in which the second board is detached from a groove in the case.

Effect of the Disclosure

A sensor ball and a home appliance system including the same according to one embodiment of the present disclosure include a case having at least some curved surfaces, a first board disposed within the case and on which a processor is disposed, and a second board electrically connected to the first board and on which a plurality of sensors are disposed, in which some of the plurality of sensors are disposed on an outer surface of the case or one end of the second board, and the other of the plurality of sensors protrudes from the outer surface of the case or one end of the second board. Accordingly, it is possible to stably sense information from various home appliances using the plurality of sensors. In particular, since the sensor protruding outward is waterproof, it is possible to reliably sense information from various home appliances using the plurality of sensors.

Meanwhile, some of the plurality of sensors may include a spectrometric sensor, an acceleration sensor, and a gyro sensor, and the other of the plurality of sensors may include a turbidity sensor and a humidity sensor. Accordingly, it is possible to stably sense information from various home appliances using the plurality of sensors.

Meanwhile, the other of the plurality of sensors may further include a biosensor. Accordingly, it is possible to stably sense sensor data about bacteria or viruses.

Meanwhile, the other of the plurality of sensors may include a turbidity sensor and a humidity sensor, and the turbidity sensor may further protrude based on the outer surface of the case or one end portion of the second board than the humidity sensor. Accordingly, it is possible to stably sense turbidity sensor data through the turbidity sensor.

Meanwhile, the second board may be detached or attached to a groove in the case. Accordingly, it is possible to attach a third board on which another sensor is disposed.

Meanwhile, in case in which the second board is attached to the groove in the case, a connector formed in the other end portion of the second board may be electrically connected to a connector of the first board by a spring formed in the groove in the case. Accordingly, the second board can be stably fixed to the first board.

Meanwhile, the sensor ball and the home appliance system including the same according to one embodiment of the present disclosure may further include a third board attached in place of the second board and electrically connected to the first board and in which a plurality of sensors are disposed, in case in which the second board is detached from the groove in the case. Accordingly, it is possible to vary the sensing sensor depending on the type of home appliance.

Meanwhile, the third board may protrude further out of the case than the second board. Accordingly, it is possible to stably sense information from air product-based home appliances through the third board that does not require a waterproof function.

Meanwhile, the number of sensors disposed on the third board may be greater than the number of sensors disposed on the second board. Accordingly, it is possible to reliably sense information from air product-based home appliances.

A width of a connector of the second board and a width of a connector of the third board may be the same, and a size of an area where the plurality of sensors are disposed on the third board may be larger than a size of an area where the plurality of sensors are disposed on the second board. Accordingly, information from air product-based home appliances can be sensed stably and accurately.

The plurality of sensors disposed on the third board may protrude from the outer surface of the case. Accordingly, information from air product-based home appliances can be sensed stably and accurately.

The plurality of sensors disposed on the third board may include a spectrometric sensor, an acceleration sensor, a gyro sensor, a dust sensor, a gas sensor, and a humidity sensor. Accordingly, information from air product-based home appliances can be sensed stably and accurately.

The plurality of sensors disposed on the third board further may include a biosensor. Accordingly, it is possible to stably sense sensor data about bacteria or viruses.

Meanwhile, the first board may further include a communication module configured to perform wireless communication with a home appliance, and the communication module may perform pairing with the home appliance based on strength of a received RF signal, and transmit sensor data sensed by the plurality of sensors to the paired home appliance. Accordingly, it is possible to transmit various sensor data to paired home appliances.

The first board may further include a communication module configured to perform wireless communication with a home appliance, and the communication module may perform pairing with the home appliance based on strength of a received RF signal in case in which a connection button is pressed for a predetermined time or more, and may transmit sensor data required for the paired home appliance among sensor data sensed from a plurality of sensors. Accordingly, it is possible to transmit various sensor data to the paired home appliance.

The communication module may transmit, in case in which the paired home appliance is a washing machine, sensor data sensed from a spectrometric sensor, a turbidity sensor, an acceleration sensor, and a gyro sensor to the washing machine, in case in which the paired home appliance is a dryer, transmits the sensor data sensed from the spectrometric sensor, the turbidity sensor, the acceleration sensor, the gyro sensor, and the humidity sensor to the dryer, and in case in which the paired home appliance is a dishwasher, the sensor data sensed from the spectrometric sensor, the turbidity sensor, and the humidity sensor to the dishwasher. Accordingly, sensor data may be varied and transmitted depending on the type of home appliance.

The first board may further includes a communication module configured to perform wireless communication with a home appliance, and the communication module may transmit, in case in which the paired home appliance is a clothing manager, sensor data sensed from spectrometric sensor, an a acceleration sensor, a gyro sensor, a humidity sensor, and a dust sensor to the clothing manager, in case in which the paired home appliance is an air purifier, sensor data sensed from a gas sensor and the dust sensor to the air purifier, and in case in which the paired home appliance is a refrigerator, the sensor data sensed from the gas sensor and the humidity sensor to the refrigerator. Accordingly, sensor data can be varied and transmitted depending on the type of home appliance.

The first board may further include a communication module configured to perform wireless communication with a home appliance, and the communication module may perform pairing with a plurality of home appliances, and transmit sensor data required for each of the plurality of paired home appliances among the sensor data sensed by the plurality of sensors. Accordingly, sensor data can be varied and transmitted depending on the type of home appliance.

In a state where the processor is paired with a washing machine, the processor determines laundry tangles based on sensor data sensed by an acceleration sensor and a gyro sensor, and transmits determined laundry tangle information to the washing machine. Accordingly, it is possible to accurately determine the laundry tangles through the sensor ball and transmit related information to the washing machine.

A sensor ball and a home appliance system having the same according to still another embodiment of the present disclosure includes a case having at least some curved surfaces, a first board disposed within the case and on which a processor is disposed, a second board electrically connected to the first board and on which a plurality of sensors are disposed, and a third board attached in place of the second board and electrically connected to the first board and in which a plurality of sensors disposed, in case in which the second board is detached from a groove in the case. Accordingly, it is possible to stably sense information from various home appliances using the plurality of sensors. In particular, since the sensor data in case in which the second board is mounted and the sensor data in case in which the third board is mounted are varied, it is possible to stably sense information from various home appliances.

BRIEF DESCRIPTION OF THE DRAWINGS

FIG. 3B is a side view of FIG. 3a.

DETAILED DESCRIPTION OF THE PREFERRED EMBODIMENTS

Hereinafter, the present disclosure will be described in detail with reference to the accompanying drawings.

Regarding constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
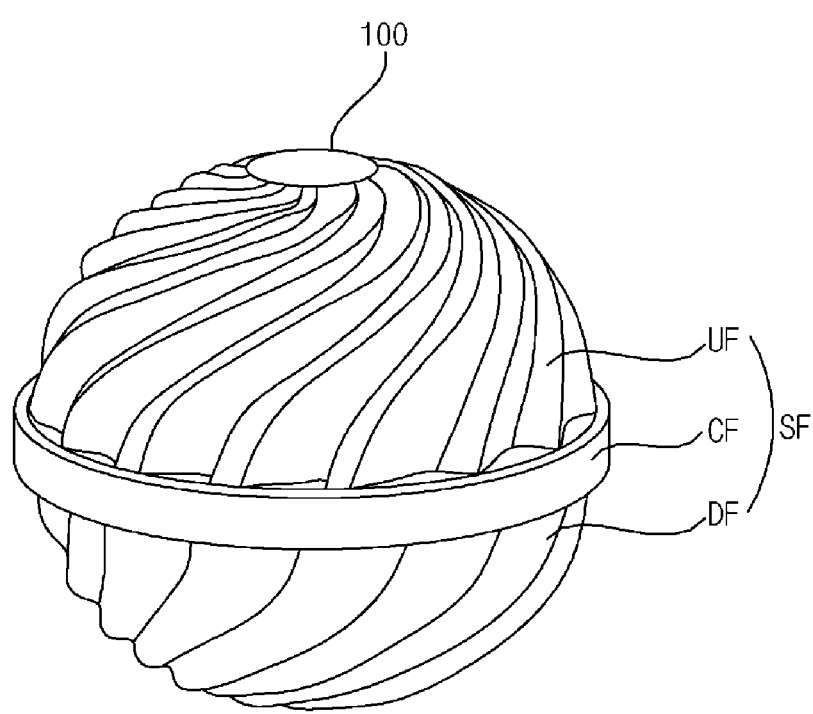
FIG. 1 is a view illustrating a sensor ball according to one embodiment of the present disclosure.

FIG. 1 is a diagram illustrating a sensor ball according to one embodiment of the present disclosure.

Referring to the drawings, a sensor ball 100 according to one embodiment of the present disclosure includes a case SF having at least some curved surfaces.

The case SF may have a sphere shape as illustrated in the drawing, but is not limited to this and various modifications such as an elliptical shape, a donut shape, and a polygonal shape are possible.

Meanwhile, the case SF may include an upper case UF, a lower case DF, and a combined case CF that couples the upper case UF and the lower case DF.

Meanwhile, within the case SF, especially within the combined case CF, a first board (BDa in FIG. 3a) on which a processor 170 is disposed may be disposed.

Meanwhile, although not illustrated in the drawing, a groove (Hmm in FIG. 3B) is formed in a part of the case SF, for example, in the combined case CF, and a second board (BDb in FIG. 3a) on which a plurality of sensors are disposed can be coupled to the groove Hmm.

Meanwhile, some of the plurality of sensors are disposed on an outer surface (OFa in FIG. 3a) of the case SF, and the other of the plurality of sensors protrudes from the outer surface (OFa in FIG. 3a) of the case SF. Accordingly, it is possible to stably sense information from various home appliances HA using the plurality of sensors. In particular, waterproofing is performed even in case in which the sensors protrude from the outer surface OFa protrudes, and thus, it is possible to stably sense information from various home appliances HA using the plurality of sensors in a waterproof state.

Meanwhile, the second board BDb on which the plurality of sensors are disposed can be detached or attached, and in case in which detaching the second board BDb on which the plurality of sensors are disposed, a sensor disposed on the second board BDb and a third board BDc on which the other of the plurality of sensors are disposed may be coupled to the groove Hmm formed in a part of the case SF. Accordingly, it is possible to stably obtain sensor information using the plurality of sensors in the third board BDc.

Figure 2:
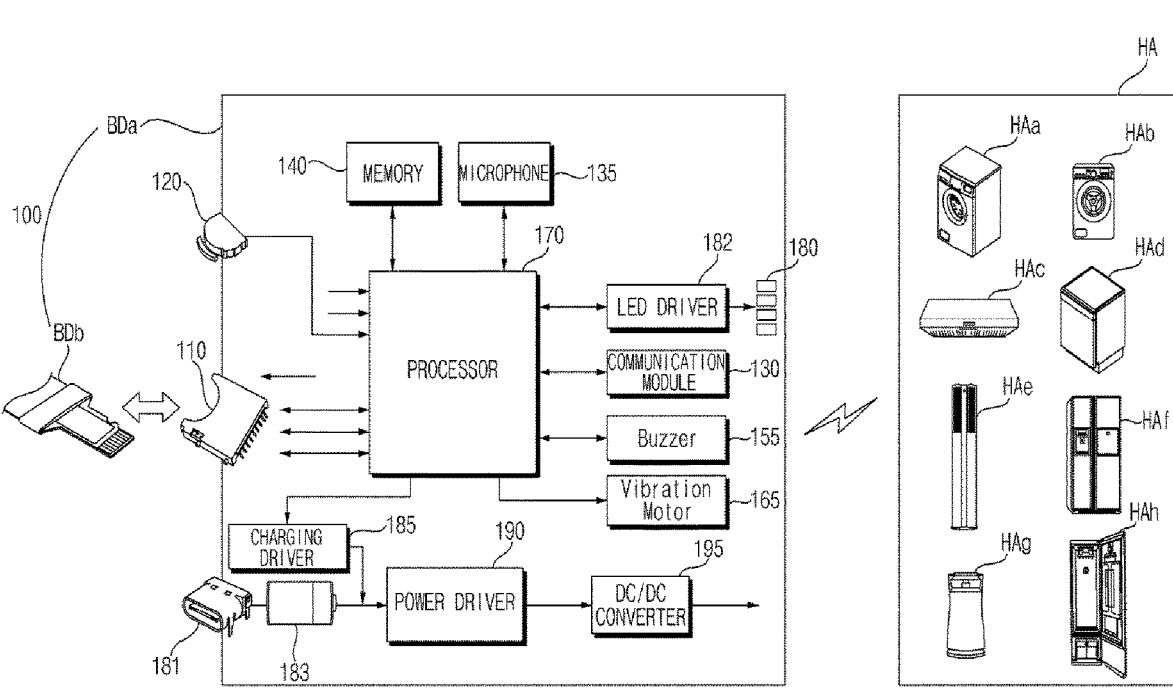
FIG. 2 is a diagram illustrating a home appliance system according to one embodiment of the present disclosure.

FIG. 2 is a diagram illustrating a home appliance system according to one embodiment of the present disclosure.

Referring to the drawing, a home appliance system 10 according to one embodiment of the present disclosure may include the sensor ball 100 and a home appliance HA.

The home appliance HA may be a washing machine HAa, a dryer HAb, or a dishwasher HAd that uses water to wash laundry or containers.

Alternatively, the home appliance HA may be a clothing manager HAh, an air purifier HAg, a refrigerator HAf, a hood Hac, or an air conditioner HAe based on air control.

In addition, the home appliance HA may be a concept that includes various products such as water purifiers and robot vacuum cleaners.

The sensor ball 100 according to one embodiment of the present disclosure includes a connector 110, a connection button 120, a communication module 130, a microphone 135, a memory 140, an audio output unit 155, a vibration motor 165, a processor 170, a display 180, a power connector 181, a display driver 182, a battery 183, a charging driver 185, a power driver 190 and a dc/dc converter 195, which are disposed within the first board BDa.

The connector 110 is electrically connected to a connector CTa of the second board BDb having a plurality of sensors, and can exchange electrical signals with the second board BDb.

Meanwhile, in case in which the third board BBDc is connected to the connector 110, the connector 110 is electrically connected to a connector CTb of the third board BDc having the plurality of sensors and can exchange electrical signals with the third board BDc.

The connection button 120 may operate for pairing with the home appliance HA.

For example, in case in which the connection button 120 is pressed for a predetermined time or more, the processor 170 can control the communication module 130 to perform pairing.

Specifically, in case in which the connection button 120 is pressed for a predetermined time or more, the communication module 130 may perform pairing with a home appliance HA based on strength of a received RF signal and transmit sensor data required for the paired home appliance HA among sensor data sensed from the plurality of sensors. Accordingly, various sensor data can be transmitted to the paired home appliance HA.

Meanwhile, in addition to the connection button 120, a power button (not illustrated) may be provided separately.

Alternatively, in case in which the connection button 120 is pressed briefly, power is turned on/off, and in case in which the connection button 120 is pressed for a predetermined time or more, the communication module 130 may enter a pairing mode.

The communication module 130 may exchange data with the server 300 or a home appliance HA.

For example, the communication module 130 may perform Bluetooth communication, UWB communication, Zig-Bee communication, Wi-SUN communication, Z-Wave communication, NFC communication, infrared communication, or the like for data exchange with home appliance HA.

Meanwhile, the communication module 130 may perform Wi-Fi communication to exchange data with the server 300.

Meanwhile, the communication module 130 can perform pairing with a home appliance HA based on the strength of the received RF signal and transmit sensor data sensed from a plurality of sensors to the paired home appliance HA. Accordingly, various sensor data can be transmitted to the paired home appliance HA.

The microphone 135 collects sound around the sensor ball 100. For example, the microphone 135 may collect voices or operation sounds of home appliances.

Meanwhile, the microphone 135 may collect the sound of laundry tangling in case in which the sensor ball 100 is input into the washing machine.

The memory 140 may store data related to the operation of the sensor ball 100.

The sound output unit 155 may output sound for an operating state of the sensor ball 100. In particular, depending on the operating state of the sensor ball 100, different levels of sound can be output.

The vibration motor 165 may output vibration for the operating state of the sensor ball 100. In particular, depending on the operating state of the sensor ball 100, different levels of vibration can be output.

The processor 170 may control the overall operation of the sensor ball 100.

Meanwhile, the processor 170 may be configured to transmit sensor data collected from a plurality of sensors in the sensor ball 100 to the paired home appliance.

Meanwhile, the processor 170 may be configured to perform Firmware Over the Air through firmware update information received from an external server 300.

For example, the processor 170 may control to update the firmware stored in the memory 140 through firmware update information received from the external server 300.

Meanwhile, the processor 170 may perform artificial intelligence (AI)-based or deep learning-based learning based on sensor data, and identify the operating state of the home appliance HA where the sensor ball 100 is disposed.

Additionally, the processor 170 may control transmission of operation information suitable for the home appliance HA based on the identified operating state of the home appliance HA.

Meanwhile, the processor 170 may perform voice recognition in case in which a voice is included among the sounds collected by the microphone 135, and perform control to transmit driving information suitable for the home appliance HA based on the recognized voice.

The display 180 may display information according to the operating state of the sensor ball 100. For example, in case in which the display 180 includes a plurality of LEDs, light of different colors or blinking may be output depending on the operating state of the sensor ball 100.

The display driver 182 outputs a control signal to drive the display 180.

The power connector 181 is a connector for power charging of the sensor ball 100, and external DC power can be input to the power connector.

The battery 183 may store the DC power input through the power connector 181, or the like or provide the stored DC power to the power driver 190.

The charging driver 185 may control charging of the battery 183 with DC power or discharging of the DC power of the battery 183 according to the control of the processor 170.

The power driver 190 may convert the level of DC power from the battery 183 or the power connector 181 and provide the level-converted DC power to the dc/dc converter 190.

For example, the power driver 190 may include a boost converter and convert input power of a first level DC into second level DC power, which is a level greater than the first level, and output the converted DC power.

The dc/dc converter 195 may convert the level of DC power from the power driver 190 and output the level-converted DC power.

For example, the dc/dc converter 195 may convert second-level DC power into third-level DC power, which is a level lower than the second level, and output the converted DC power.

The DC power output from the dc/dc converter 195 may be provided to the processor 170, or the like.

Figure 3A:
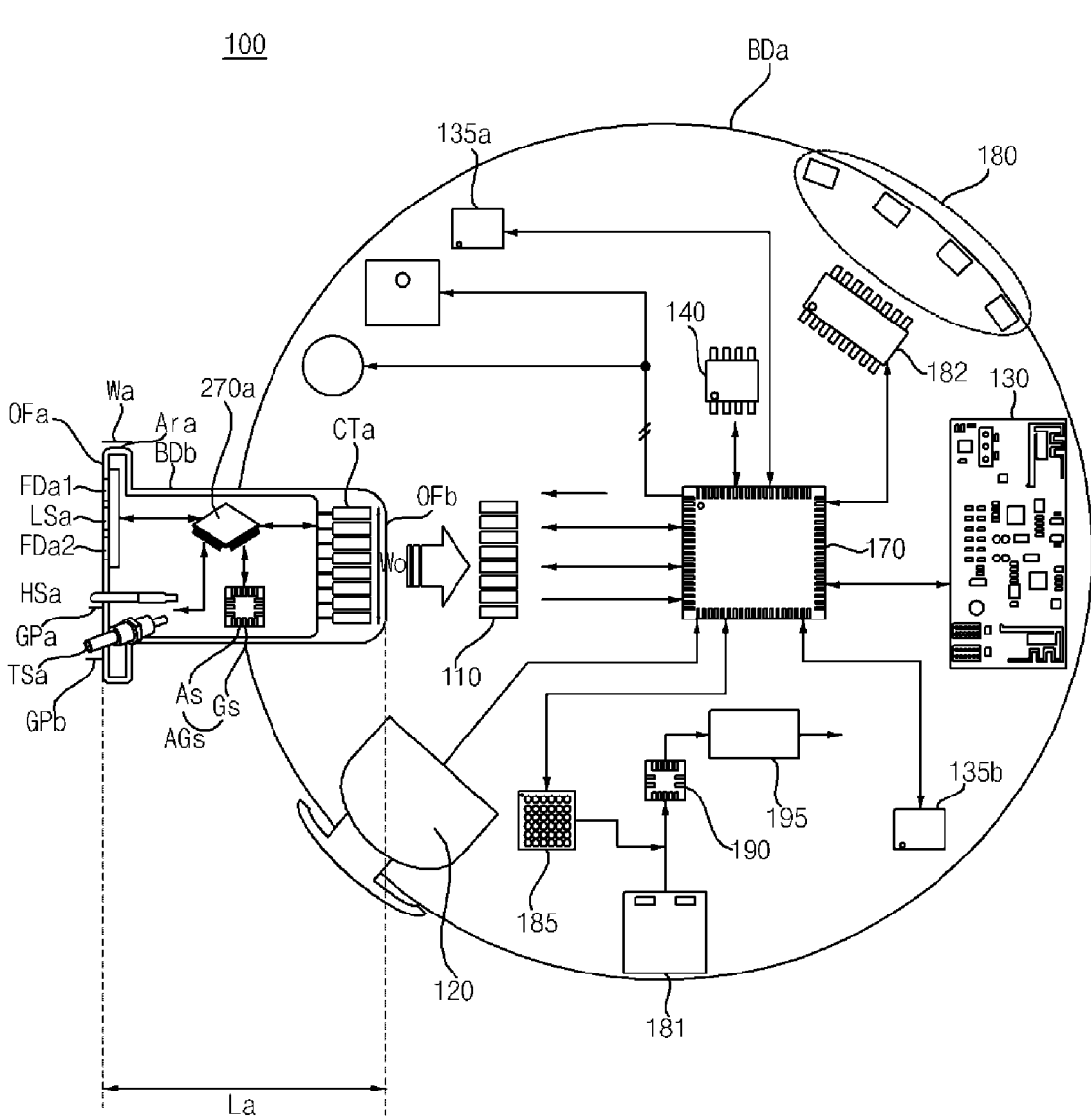
FIG. 3A is a circuit diagram of a sensor ball on which a second board is mounted.
Figure 3B:
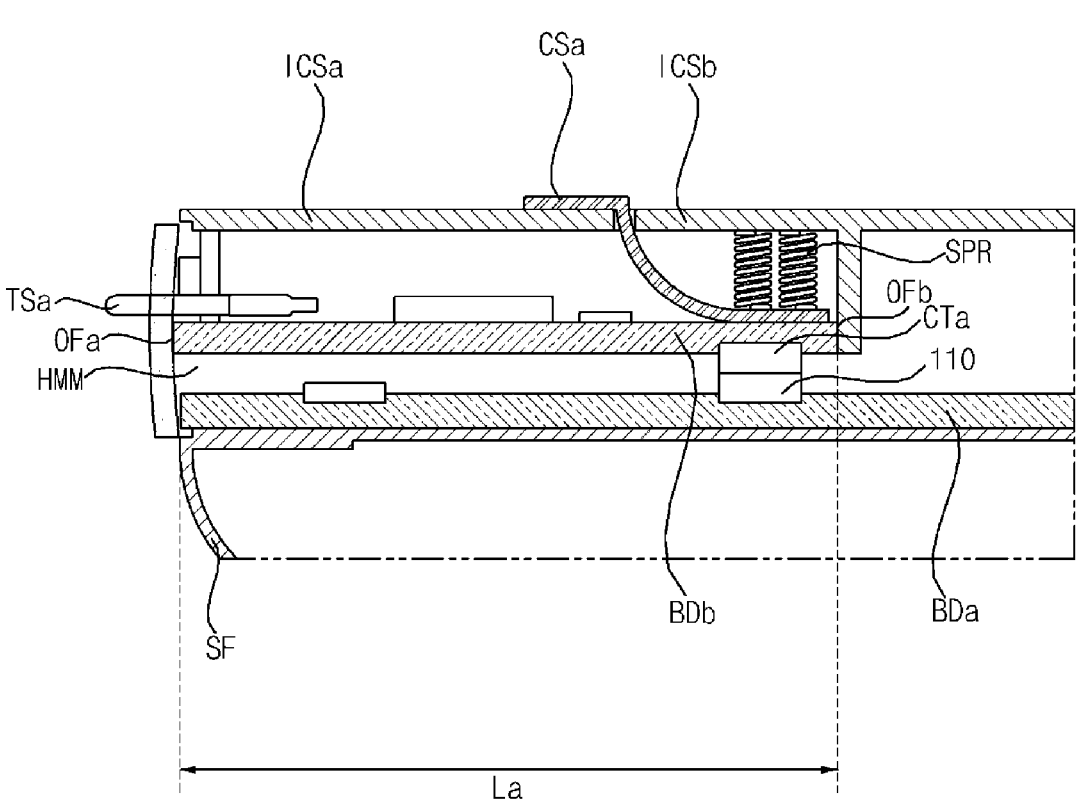

FIG. 3a is a circuit diagram of the sensor ball on which the second board is mounted, and FIG. 3B is a side view of FIG. 3a.

Referring to the drawing, the sensor ball 100 according to one embodiment of the present disclosure includes the first board BDa on which the processor 170 is disposed and the second board Bdb which are electrically connected to the first board BDa and on which the plurality of sensor are disposed.

In the drawing, in an area Ara where the plurality of sensors are disposed, near the one end portion OFa of the second board BDb, from top to bottom, a first light source FDa1, a spectrometric sensor LSa, a second light source FDa2, a humidity sensor HSa, and a turbidity sensor TSa are provided.

The spectrometric sensor (spectrometric sensor) (LSa) is disposed between the first light source FDa1 and the second light source FDa2, and may sense spectrum of light incident on the sensor ball 100 based on the operations of the first light source FDa1 and the second light source FDa2.

For example, the spectrometric sensor LSa may be used to distinguish cloth, types of tableware, food materials, or the like.

The humidity sensor HSa may sense the humidity around the sensor ball 100. Meanwhile, the humidity sensor HSa may be formed integrally with a temperature sensor. Accordingly, the humidity sensor HSa may sense temperature information and humidity information together.

The turbidity sensor TSa may sense turbidity around the sensor ball 100. For example, a turbidity sensor TSa may be used to determine the turbidity of washing water.

Meanwhile, the second board BDb may be mounted on the sensor ball 100 for the washing machine HAa, the dryer HAb, or the dishwasher HAd that washes laundry or containers using water.

A connector CTa is formed in the other end portion OFb opposite to the one end portion OFa of the second board BDb.

Meanwhile, an acceleration sensor AS, a gyro sensor GS, and a second processor 270a may be disposed between the area Ara where the plurality of sensors are disposed and an area where the connector CTa is formed.

In this case, the acceleration sensor AS and gyro sensor GS may be implemented as a single 12-axis sensor AGS.

The second processor 270a may collect sensor data collected from the spectrometric sensor LSa, the humidity sensor HSa, the turbidity sensor TSa, the acceleration sensor AS, the gyro sensor GS, or the like, and transmit the collected sensor data to the connector CTa.

Meanwhile, since the first light source FDa1, the spectrometric sensor LSa, and the second light source FDa2 perform light output or light collection, first light source FDa1, the spectrometric sensor LSa, and the second light source FDa2 are not necessary to protrude from the outer surface of the case SF or one end portion OFa of the second board BDb, and it is desirable that at least part of the one end portion OFa of the second board BDb is transparent.

That is, it is desirable that the first light source FDa1, the spectrometric sensor LSa, and the second light source FDa2 are disposed within the outer surface of the case SF or one end portion OFa of the second board BDb.

Meanwhile, since the acceleration sensor AS and gyro sensor GS also sense acceleration information, angular velocity information, or the like, the acceleration sensor AS and gyro sensor GS are not necessary to protrude from the outer surface of the case SF or the one end portion OFa of the second board BDb.

In the drawing, the acceleration sensor AS and gyro sensor GS are disposed within the outer surface of the case SF or one end portion OFa of the second board BDb.

In particular, the disposition locations of the acceleration sensor AS and gyro sensor GS are further apart from the outer surface of the case SF or the one end portion OFa of the second board BDb than the first light source FDa1, the spectrometric sensor LSa, and the second light source FDa2, and is disposed inside the second board BDb.

Meanwhile, it is desirable that the turbidity sensor TSa and humidity sensor HSa protrude from the outer surface of the case SF or the one end portion OFa of the second board BDb in order to sense accurate turbidity sensor data and accurate humidity information.

That is, it is desirable that some of the plurality of sensors in the second board BDb within the sensor ball 100 according to one embodiment of the present disclosure are within the outer surface of the case SF or one end portion OFa of the second board BDb, or the other of the plurality of sensors protrude from the outer surface of the case SF or one end portion OFa of the second board BDb.

Accordingly, it is possible to stably sense information from various home appliances HA using a plurality of sensors.

Specifically, some of the plurality of sensors may include the spectrometric sensor LSa, the acceleration sensor AS, and the gyro sensor GS, and the other of the plurality of sensors may include the turbidity sensor TSa and the humidity sensor HSa. Accordingly, it is possible to stably sense information from various home appliances HA using the plurality of sensors.

Meanwhile, it is desirable that the end portion of the sensor protruding from the outer surface of the case SF or the one end portion OFa of the second board BDb is waterproofed. That is, it is desirable that the protruding portions of the turbidity sensor TSa and humidity sensor HSa be waterproofed.

Meanwhile, although not illustrated in the drawing, a biosensor (not illustrated) may be further included below the turbidity sensor TSa.

In other words, the sensor that protrudes from the outer surface of the case SF or the one end portion OFa of the second board BDb may further include the biosensor (not illustrated). Accordingly, it is possible to stably sense sensor data about bacteria or viruses.

In case in which an electrode labeled with a bioreceptor such as an enzyme, antibody, or nucleic acid includes a substance to be detected or a substance capable of mediating a signal, viral targets are detected by fixing a bioreceptor to an electrode and comparing a voltage-current curve according to the application of a detection substance, or a specific material is coupled or fixed to the surface of a metal thin film, the biosensor (not illustrated) can sense bacteria or viruses by using a phenomenon in which the refractive index of a metal surface changes.

Meanwhile, the turbidity sensor TSa protrudes further based on the outer surface of the case SF or the one end portion OFa of the second board BDb than the humidity sensor HSa.

In the drawing, based on the one end portion OFa of the second board BDb, the humidity sensor HSa protrudes by Gpa, and the turbidity sensor TSa protrudes by GPb, which is larger than Gpa.

Accordingly, it is possible to accurately and stably sense turbidity sensor data from the turbidity sensor TSa.

Referring to FIG. 3B, the second board BDb is detached or attached to the groove Hmm in the case SF.

Meanwhile, in case in which the second board BDb is attached to the groove Hmm in the case SF, the connector CTa formed on the other end portion of the second board BDb is electrically connected to the connector 110 of the first board BDa by the spring SPR formed in the groove Hmm in the case SF. Accordingly, the second board BDb can be stably fixed to the first board BDa.

In FIG. 3B, the second board BDb is inserted into the groove Hmm in the case SF formed on the upper side of the first board BDa, and the connector CTa formed in the other end portion of the second board BDb is electrically connected to the connector 110 of the first board BDa by the spring SPR formed in the groove Hmm.

Meanwhile, in the upper portion of the second board BDb, a first inner case ICSa and a second inner case ICSb of the sensor ball 100 are disposed spaced apart, and a connection member CSa connecting between an upper surface of the first inner case ICSa and a lower surface of the spring SPR is disposed.

With this structure, the second board BDb is attached to or detached from the connector 110 of the first board BDa.

Meanwhile, the length between one end portion OFa and the other end portion OFb of the second board BDb may be La.

Figure 4A:
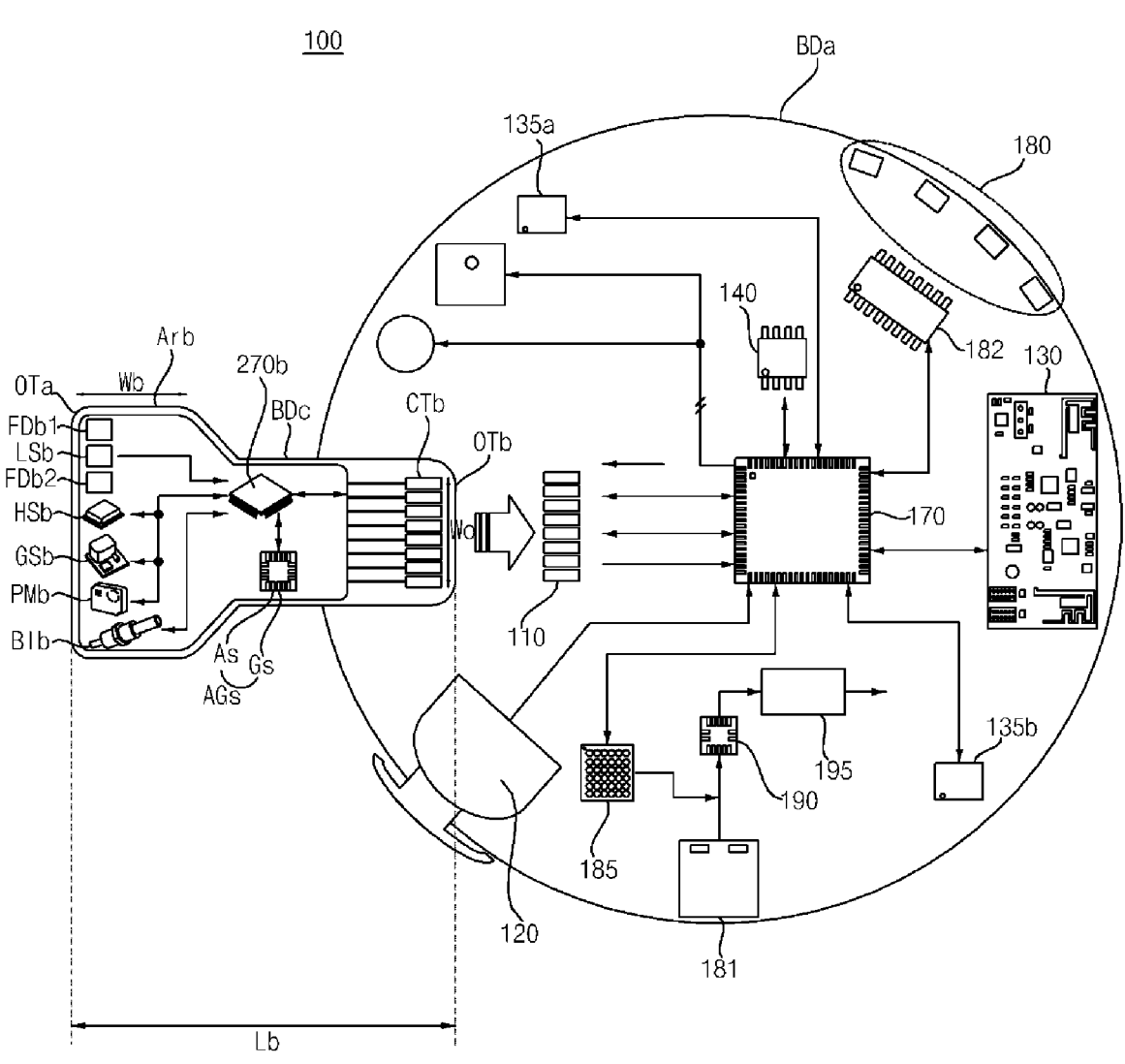
FIG. 4A is a circuit diagram of a sensor ball on which a third board is mounted.
Figure 4B:
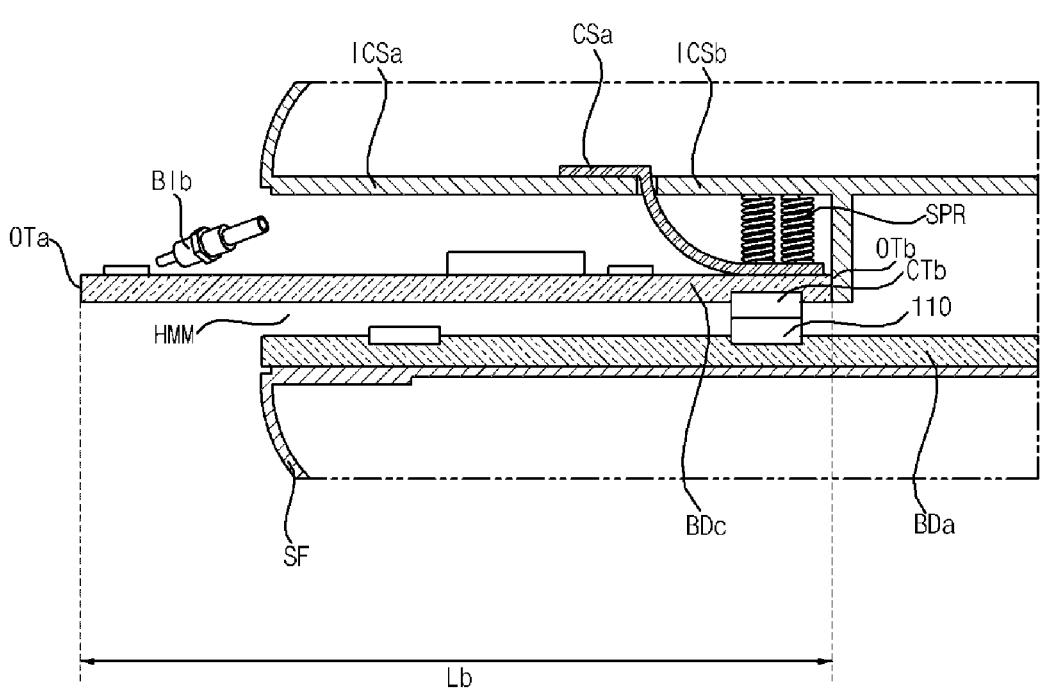
FIG. 4B is a side view of FIG. 3B.

FIG. 4A is a circuit diagram of the sensor ball on which the third board is mounted, and FIG. 4B is a side view of FIG. 3B.

Referring to the drawing, the sensor ball 100 according to one embodiment of the present disclosure includes the first board BDa on which the processor 170 is disposed, and the third board BDc which is electrically connected to the first board BDa and on which the plurality of sensors are disposed.

In the drawing, in an area Arb which is located near the one end portion OTa of the third board BDc and in which the plurality of sensors are disposed, from top to bottom, a first light source FDb1, a spectrometric sensor LSb, a second light source FDb2, a humidity sensor HSb, a gas sensor GSb, a dust sensor PMb, and a biosensor BIb are provided.

The spectrometric sensor LSb is disposed between the first light source FDb1 and the second light source FDb2, and may sense the spectrum of light incident on the sensor ball 100 based on the operations of the first light source FDb1 and the second light source FDb2.

For example, the spectrometric sensor LSa may be used to distinguish cloth, types of tableware, food materials, or the like.

The humidity sensor HSb can sense the humidity around the sensor ball 100. Meanwhile, the humidity sensor HSb may be formed integrally with the temperature sensor. Accordingly, the humidity sensor HSb may sense temperature information and humidity information together.

The gas sensor GSb senses VOC gases such as carbon monoxide (CO), hydrogen sulfide ($H_2S$), benzene, toluene, xylene, and ethylene.

The dust sensor PMb senses the air quality of the surrounding environment.

The biosensor BIb senses bacteria or viruses.

Meanwhile, the third board BDc may be mounted on the sensor ball 100 for the clothing manager HAh, the air purifier the refrigerator HAf, the hood Hac, and the air HAg, conditioner HAe, based on air control.

A connector CTb is formed on the other end portion OTb opposite to the one end portion OTa of the third board BDc.

Meanwhile, the acceleration sensor AS, the gyro sensor GS, and a third processor (270b) may be disposed between the area Arb where a plurality of sensors are disposed and the area where the connector CTb is formed.

In this case, the acceleration sensor AS and gyro sensor GS may be implemented as a single 12-axis sensor AGS.

The third 270b processor may collect sensor data collected from the spectrometric sensor LSb, the humidity sensor HSb, the gas sensor GSb, the dust sensor PMb, the biosensor BIb, the acceleration sensor AS, the gyro sensor GS, or the like, and transmit the collected sensor data to the connector CTb.

Meanwhile, since the spectrometric sensor LSb, the humidity sensor HSb, the gas sensor GSb, the dust sensor PMb, and the biosensor BIb disposed on the third board BDc should perform the sensing for air control, it is desirable that the above-described sensors protrude from the outer surface of the case SF.

That is, it is desirable for the third board BDc to protrude further out of the case SF than the second board BDb. Accordingly, it is possible to stably sense information from the home appliances HA based on air products through the third board BDc that does not require a waterproof function.

In FIG. 4B, the one end portion OFb of the third board BDc is disposed to protrude from the outer surface of the case SF, and the first light source FDb1, the spectrometric sensor LSb, the second light source FDb2, the humidity sensor HSb, the gas sensor GSb, the dust sensor PMb, and the biosensor BIb are disposed in the area Arb protruding from the outer surface of the case SF.

Meanwhile, since the first source light FDb1, the spectrometric sensor LSb, the second light source FDb2, the humidity sensor HSb, the gas sensor GSb, the dust sensor PMb, and the biosensor BIb are used for home appliances of air products, separate waterproofing treatment is not required.

Meanwhile, although not illustrated in the drawing, a turbidity sensor (not illustrated) may be further included below the biosensor BIb.

Referring to FIG. 4B, the third board BDc is detached or attached to the groove Hmm in the case SF.

For example, in case in which the second board BDb is detached from the groove Hmm in the case SF, the third board BDc on which multiple sensors are disposed is attached instead of the second board BDb and is electrically connected to the first board BDa.

Meanwhile, in case in which the third board BDc is attached to the groove Hmm in the case SF, the connector CTb formed in the other end portion of the third board BDc is electrically connected to the connector 110 of the first board BDa by the spring SPR formed in the groove Hmm in the case SF. Accordingly, the third board BDc can be stably fixed to the first board BDa.

In FIG. 4B, the third board BDc is inserted into the groove Hmm in the case SF formed on the upper side of the first board BDa, and the connector CTb formed in the other end portion of the third board BDc is electrically connected to the connector 110 of the first board BDa by the spring SPR formed in the groove Hmm.

Meanwhile, in the upper part of the third board BDc, the first inner case ICSa and the second inner case ICSb of the sensor ball 100 are disposed to be spaced apart from each other, and the connecting member CSa connecting between the upper surface of the first inner case ICSa and the lower surface of the spring SPR is disposed.

With this structure, the third board BDc is attached to or detached from the connector 110 of the first board BDa.

Meanwhile, comparing FIGS. 3a and 4a, a width Wo of the connector CTa of the second board BDb and a width Wo of the connector CTb of the third board BDc are the same, and it is desirable that the size of the area Arb where the plurality of sensors are disposed on the third board BDc is larger than the size of the area Ara where the plurality of sensors are disposed on the second board BDb.

For example, it is desirable that a width Wb of the area Arb where the plurality of sensors are disposed on the third board BDc is larger than a width Wa of the area Ara where the plurality of sensors are disposed on the second board BDb.

Meanwhile, a length between one end portion OTa and the other end portion OTb of the third board BDc may be Lb, which is longer than La in FIG. 3B.

Accordingly, the number of sensors disposed on the third board BDc may be more than the number of sensors disposed on the second board BDb, and ultimately, the information of home appliance HA based on air products may be sensed stably.

Meanwhile, referring to FIGS. 3a to 4b, a sensor ball 100 according to another embodiment of the present disclosure includes a case SF having at least some curved surfaces, a first board BDa disposed within the case SF and on which a processor 170 is disposed, a second board BDb electrically connected to the first board BDa and on which a plurality of sensors are disposed, and a third board BDc which is attached in place of the second board BDb and electrically connected to the first board BDa and in which a plurality of sensors disposed, in case in which the second board BDb is detached from a groove Hmm in the case SF.

Accordingly, it is possible to stably sense information from various home appliances HA using the plurality of sensors. In particular, since the sensor data in case in which the second board BDb is mounted and the sensor data in case in which the third board BDc is mounted are varied, it is possible to stably sense information from various home appliances HA.

Figure 5:
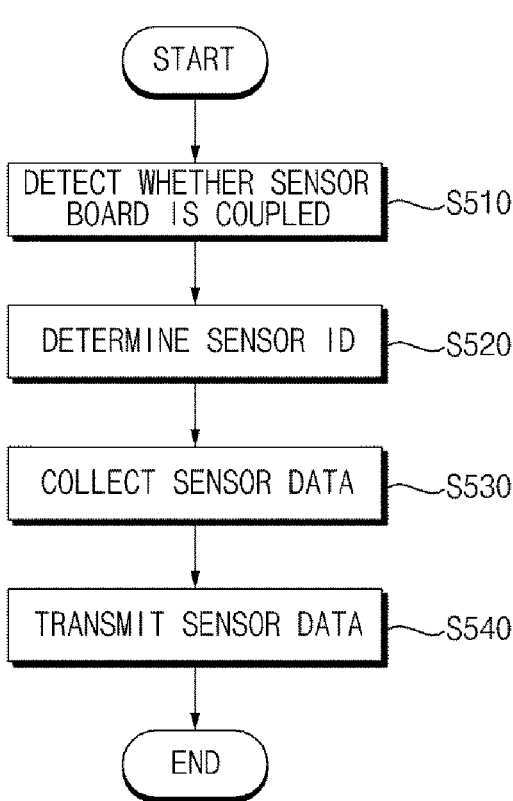
FIG. 5 is a flowchart illustrating an example of a method of operating a sensor ball according to one embodiment of the present disclosure.

FIG. 5 is a flowchart illustrating an example of a method of operating a sensor ball according to one embodiment of the present disclosure.

Referring to the drawing, the processor 170 in the sensor ball 100 detects whether the sensor board is coupled to the connector 110 of the first board BDa (S510).

The sensor board is a board on which a plurality of sensors are disposed, and may be the second board BDb of FIGS. 3a and 3b or the third board BDc of FIGS. 4a and 4b.

In case in which the second board BDb or third board BDc is electrically connected to the connector 110 of the first board BDa, the processor 170 in the sensor ball 100 may detect whether the sensor board is coupled based on the current level.

Meanwhile, in case in which the second board BDb is coupled, the processor 170 in the sensor ball 100 may detect whether the coupled sensor board is the second board BDb based on the identification (ID) information received from the second processor 270a or the like in the second board BDb.

Meanwhile, in case in which the third board BDc is coupled, the processor 170 in the sensor ball 100 may detect whether the coupled sensor board is the third board BDc based on the identification (ID) information received from the third processor 270b or the like in the third board BDc.

Next, in case in which the second board BDb is coupled, the second processor 270a in the second board BDb collects sensor data from a plurality of sensors (S530).

For example, the second processor 270a in the second board BDb may collect the spectrometric sensor data, humidity sensor data, and turbidity sensor data from the spectrometric sensor LSa, humidity sensor HSa, turbidity sensor TSa, or the like.

Meanwhile, in case in which the third board BDc is coupled, the third processor 270b in the third board BDc collects sensor data from the plurality of sensors.

For example, the third processor (270b) in the third board BDc may collect the spectrometric sensor data, the humidity sensor data, the gas sensor data, the dust sensor data, and the biosensor data from the spectrometric sensor LSb, the humidity sensor HSb, the gas sensor GSb, the dust sensor PMb, the biosensor BIb, or the like.

Meanwhile, different sensor identification (ID) information may be assigned to each sensor. For example, sensor identification information may be added to sensor data from each sensor.

Meanwhile, the second processor 270a in the second board BDb or the third processor 270b in the third board BDc may divide and collect the plurality of sensor data based on each sensor identification information in case in which collecting sensor data.

Next, the communication module 130 in the sensor ball 100 transmits the collected sensor data to the home appliance HA (S540).

For example, the communication module 130 may performs pairing with the home appliance HA based on the strength of the received RF signal and transmit sensor data sensed from the plurality of sensors to the paired home appliance HA. Accordingly, various sensor data can be transmitted to the paired home appliance HA.

As another example, in case in which the connection button 120 is pressed for a predetermined time or more, the communication module 130 may perform pairing with the home appliance HA based on the strength of the received RF signal and transmit sensor data required for the paired home appliance HA among the sensor data sensed by the plurality of sensors. Accordingly, various sensor data can be transmitted to the paired home appliance HA.

Meanwhile, in case in which the communication module 130 performs pairing with a plurality of home appliances HA and there are a plurality of paired home appliances HA, the communication module 130 may transmit the required sensor data to each of the plurality of home appliances HA.

Meanwhile, in case in which the paired home appliance HA is the washing machine HAa in a state where the second board BDb is coupled, the communication module 130 may transmit the sensor data sensed by the spectrometric sensor LSa, the turbidity sensor TSa, the acceleration sensor AS, and the gyro sensor GS to the washing machine HAa.

Meanwhile, in case in which the paired home appliance HA is the dryer Hab in a state where the second board BDb is coupled, the communication module 130 may transmit the sensor data sensed by the spectrometric sensor LSa, the turbidity sensor TSa, the acceleration sensor AS, the gyro sensor GS, and the humidity sensor HSa to the dryer HAb.

Meanwhile, in case in which the paired home appliance HA is the dishwasher Had in a state where the second board BDb is coupled, the communication module 130 may transmit the sensor data sensed by the spectrometric sensor LSa, the turbidity sensor TSa, and the humidity sensor to the dishwasher HAd.

Accordingly, in a state where the second board BDb is coupled, the sensor data can be varied and transmitted depending on the type of home appliance HA.

Meanwhile, in case in which the paired home appliance HA is the clothing manager Hah in a state where the third board BDc is coupled, the communication module 130 may transmit the sensor data sensed by the spectrometric sensor LSa, the acceleration sensor AS, the gyro sensor GS, the humidity sensor HSa, and the dust sensor PMb to the clothing manager HAh.

Meanwhile, in case in which the paired home appliance HA is the air purifier Hag in a state where the third board BDc is coupled, the communication module 130 may transmit the sensor data sensed by the gas sensor GSb and the dust sensor PMb to the air purifier HAg.

Meanwhile, in case in which the paired home appliance HA is the refrigerator HAf in a state here the third board BDc is coupled, the communication module 130 may transmit the sense data sensed by the gas sensor GSb and the humidity sensor HSa to the refrigerator HAf.

Accordingly, in a state where the third board BDc is coupled, the sensor data can be varied and transmitted depending on the type of home appliance HA.

Figure 6:
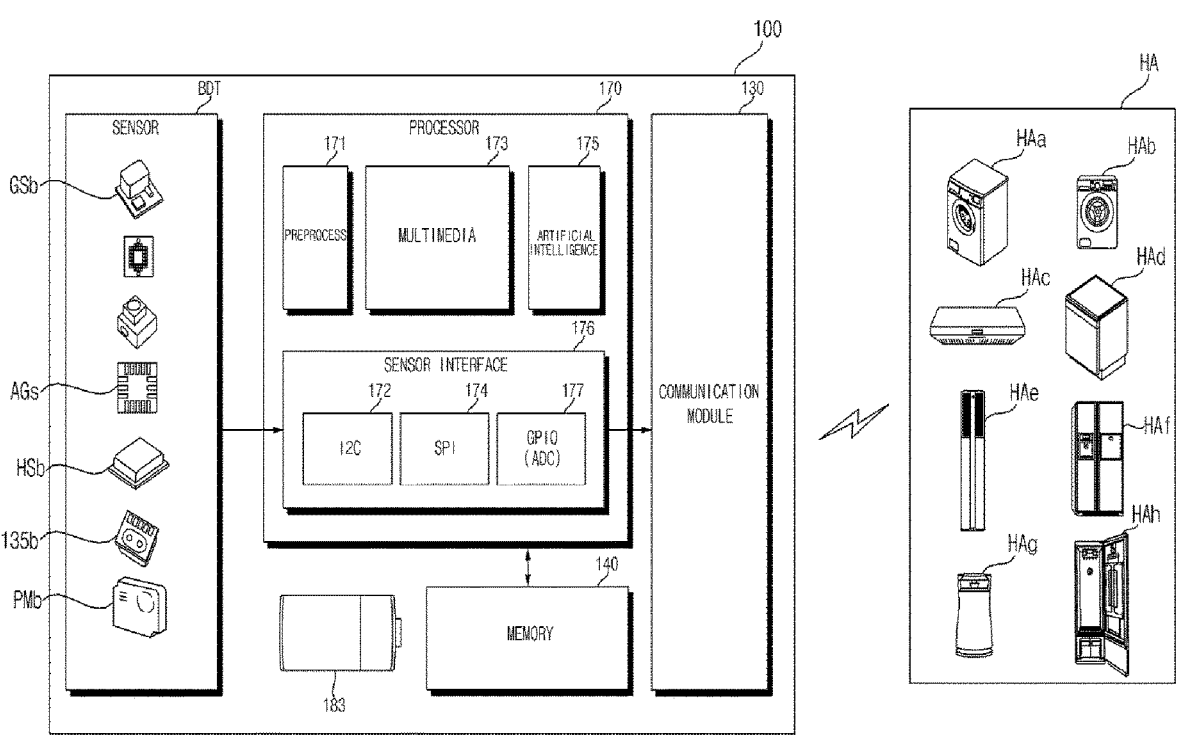
FIG. 6 is a diagram referenced in the description of a home appliance system according to one embodiment of the present disclosure.

FIG. 6 is a diagram referenced in the description of a home appliance system according to one embodiment of the present disclosure.

Referring to the drawing, in a state where the second board BDb is coupled, the plurality of sensors in the sensor ball 100 may be the spectrometric sensor LSa, the humidity sensor HSa, the turbidity sensor TSa, the acceleration sensor AS, or the gyro sensor GS, and in a state where the third board BDc is coupled, the plurality of sensors may be the spectrometric sensor LSb, the humidity sensor HSb, the gas sensor GSb, the dust sensor PMb, the biosensor BIb, the acceleration sensor AS, and the gyro sensor GS.

The communication module 130 in the sensor ball 100 may exchange data with the washing machine HAa, the dryer HAb, and the dishwasher HAd that wash laundry or containers using water, and the clothing manager HAh, the air purifier HAg, the refrigerator HAf, the hood Hac, the air conditioner HAe, or the like based on air control.

Meanwhile, the processor 170 in the sensor ball 100 may receive the plurality of sensor data and generate or process various information through signal processing on the plurality of sensor data.

To this end, the processor 170 may be provided with a sensor interface 176 for receiving the plurality of sensor data.

The sensor interface 176 may include a first interface 172 for I2C communication, a second interface 174 for SPI communication, and a third interface 177 for GPIO or ADC communication.

Meanwhile, the processor 170 includes a preprocessing unit 171 for preprocessing such as filtering of a plurality of sensor data, a multimedia processing unit 173 that provides motion sounds or motion vibrations, or processes data in multimedia, and an artificial intelligence processing unit 175 configured to perform artificial intelligence processing based on a plurality of sensor data processed in the preprocessing unit 171 to generate and output processed information.

The artificial intelligence processing unit 175 may perform artificial intelligence (AI)-based or deep learning-based learning based on sensor data, and identify the operating state of the home appliance HA where the sensor ball 100 is disposed.

For example, the artificial intelligence processing unit 175 may output food spoilage information and cooking state information based on sensor data from the gas sensor GSb or the biosensor BIb.

As another example, the artificial intelligence processing unit 175 may output laundry fabric type information, tableware type information, food material type information, or the like based on sensor data from the spectrometric sensor LSa, the spectrometric sensor LSb, or the like.

Meanwhile, the artificial intelligence processing unit 175 may generate efficient driving course information to the paired home appliance based on the sensor data and transmit the generated driving course information.

For example, the artificial intelligence processing unit 175 may generate updated driving course information that partially shortens a rinsing course in the current driving course information based on turbidity sensor data from the turbidity sensor TSa during the operation of the washing machine HAa and transmit the updated driving course information to the washing machine HAa.

Accordingly, the operating washing machine HAa may operate by shortening the rinsing course time based on the updated operation course information from the sensor ball 100.

As another example, during the operation of the air purifier HAg, in case in which the dust sensor data from the dust sensor PMb is below the standard level, in order to reduce power consumption, the artificial intelligence processing unit 175 may generate driving course information that causes the air purifier HAg to be terminated after a first period, and transmit the generated driving course information to the air purifier HAg.

Accordingly, the operating air purifier HAg can terminate the operation shorter than the preset operation time based on the generated driving course information received from the sensor ball 100.

Figure 7:
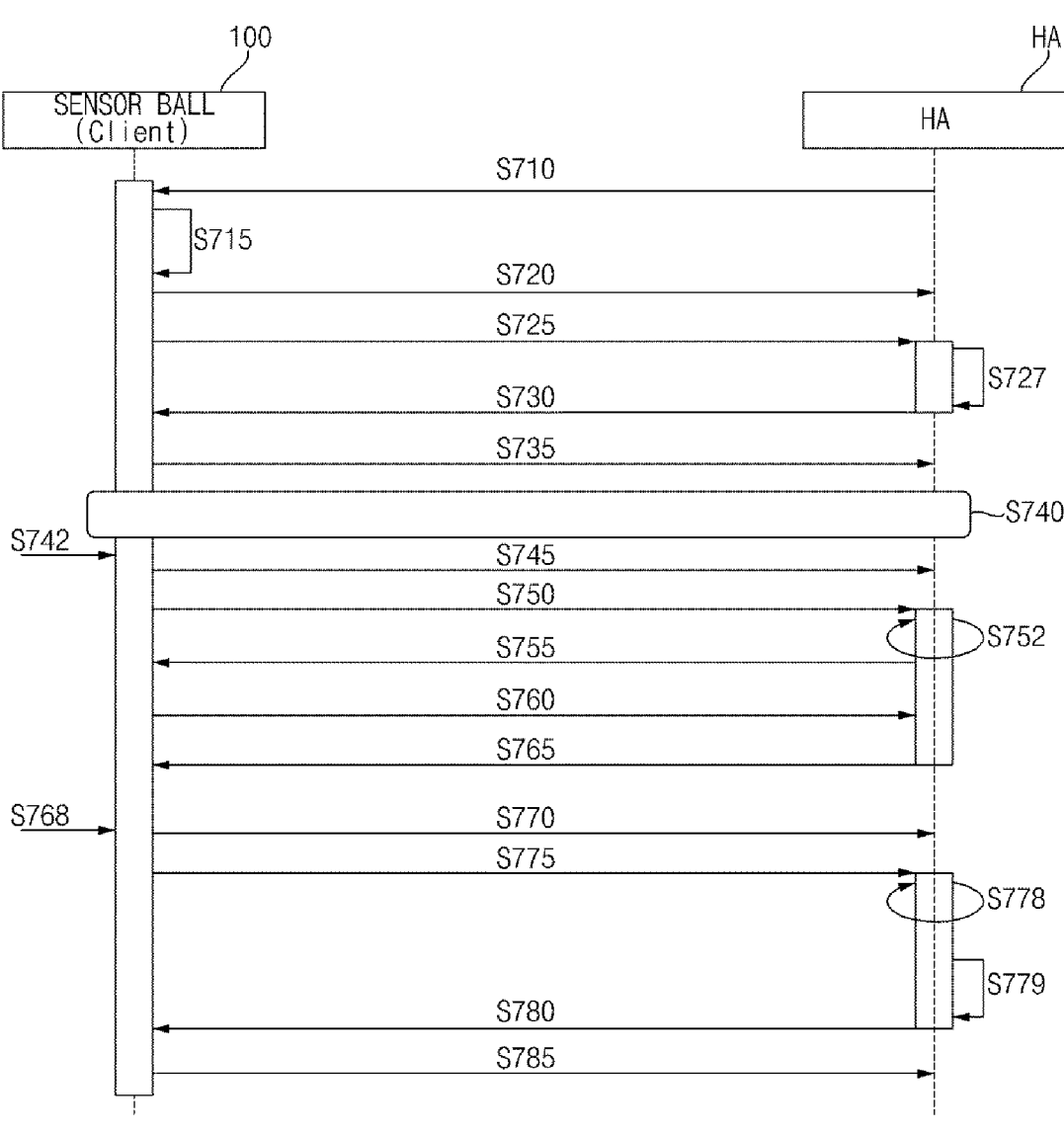
FIG. 7 is a flowchart illustrating an example of a method of operating a sensor ball and a home appliance according to one embodiment of the present disclosure.

FIG. 7 is a flowchart illustrating an example of the method of operating the sensor ball and the home appliance according to one embodiment of the present disclosure.

Referring to the drawing, the home appliance HA outputs an advertising signal (S710). Correspondingly, the sensor ball 100 periodically receives at least one advertising signal.

Next, the communication module 130 in the sensor ball 100 checks the identification information in the advertising signal (S715).

Next, the communication module 130 in the sensor ball 100 connects to the home appliance HA based on the identification information in the advertising signal (S720).

Additionally, the communication module 130 in the sensor ball 100 transmits a registration request signal to the home appliance HA based on the identification information in the advertising signal (S725).

In response to receiving the registration request signal, the home appliance HA checks the identification information of the sensor ball 100 (S727) and performs registration of the sensor ball 100.

After registering the sensor ball 100, the home appliance HA transmits a registration completion notification to the sensor ball 100 (S730).

The communication module 130 in the sensor ball 100 receives a registration completion notification and transmits a request related to address information (S735).

Next, in case in which the connection button 120 is pressed for a predetermined time or more and a pairing event occurs (S742), the communication module 130 in the sensor ball 100 connects the home appliance HA based on the identification information in the advertising signal (S745).

Then, based on the pairing event, the communication module 130 in the sensor ball 100 transmits a pairing request signal to the home appliance HA (S750).

In response, the communication module (not illustrated) of the home appliance HA performs scheduling for data transmission and reception and performs pairing with the communication module 130 in the sensor ball 100 (S752).

Accordingly, the communication module (not illustrated) of the home appliance HA transmits pairing notification setting (S755).

Then, the communication module 130 in the sensor ball 100 transmits a pairing data request (S760).

The communication module (not illustrated) of the home appliance HA transmits the pairing data result notification setting or the pairing response signal in response to the pairing data request (S765).

Accordingly, the pairing between the communication module 130 in the sensor ball 100 and the communication module (not illustrated) of the home appliance HA is completed.

Next, in case in which an event such as wireless activation, discover, wake-up, or synchronization occurs (S768), the communication module 130 in the sensor ball 100 connects to the home appliance HA (S770).

Next, the communication module 130 in the sensor ball 100 transmits a request related to the wireless activation, discover, or wake-up (S775).

In response, the communication module (not illustrated) of the home appliance HA receives the request and performs the wireless activation, discover, or wakeup (S778).

Next, the communication module (not illustrated) of the home appliance HA performs the wireless synchronization (S779) and transmits a synchronization notification setting (S780).

Then, the communication module 130 in the sensor ball 100 may terminate the connection to the appliance HA after receiving the synchronization notification setting (S785).

Figure 8:
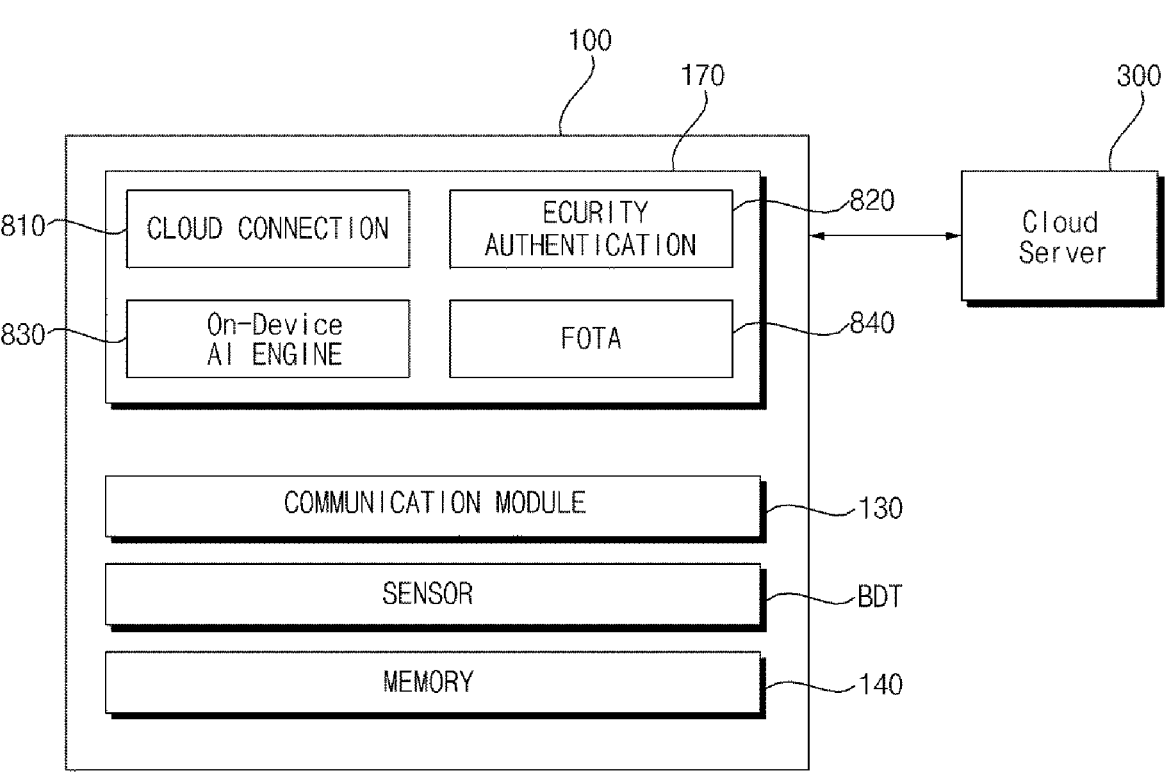
FIG. 8 is a diagram referenced to explain updating a sensor ball using a server.

FIG. 8 is a diagram referenced to explain updating the sensor ball using a server.

Referring to the drawing, the sensor ball 100 may perform communication with the server 300 and exchange data.

For example, the communication module 130 in the sensor ball 100 may connect to the server 300 and receive update data from the server 300 based on wireless communication.

Meanwhile, the processor 170 may perform control related to connection 810 with the server 300 or home appliance HA, perform artificial intelligence signal processing based on an artificial intelligence engine 830, or perform signal processing related to security authentication (820).

For example, the processor 170 may perform signal processing for learning, evolution, or inference, personalization, and latency improvement according to sensor fusion of the plurality of sensors. In this way, since artificial intelligence signal processing is not performed in the server 300 and artificial intelligence processing is possible in the processor 170 within the sensor ball 100, rapid and real-time data processing is possible.

Meanwhile, the processor 170 may output a control signal for changing (that is, on or off, changing of operation time, changing of operation intensity, changing of operation direction, changing of operation speed, or changing of the number of operations) the operation of the home appliance based on the sensor data from the plurality of sensors. Accordingly, it is possible to provide convenience such as improved performance and efficient operation of home appliance HA.

Meanwhile, the processor 170 may output a control signal for collaborative operation of a plurality of home appliances based on sensor data from the plurality of sensors.

Meanwhile, the processor 170 may output a home appliance operation control signal to reduce power consumption based on sensor data from a plurality of sensors.

Meanwhile, the processor 170 may receive firmware update data from the server 300 and, based on the received firmware update data, perform a Firmware Over-The-Air (FOTA) stored in the internal memory 140, or the like (840).

Meanwhile, the processor 170 may receive update data from the server 300 and update software related to the operation of the communication module 130.

The processor 170 may receive update data from the server 300 and update software related to the operations of the plurality of sensors BDT.

Figure 9A:
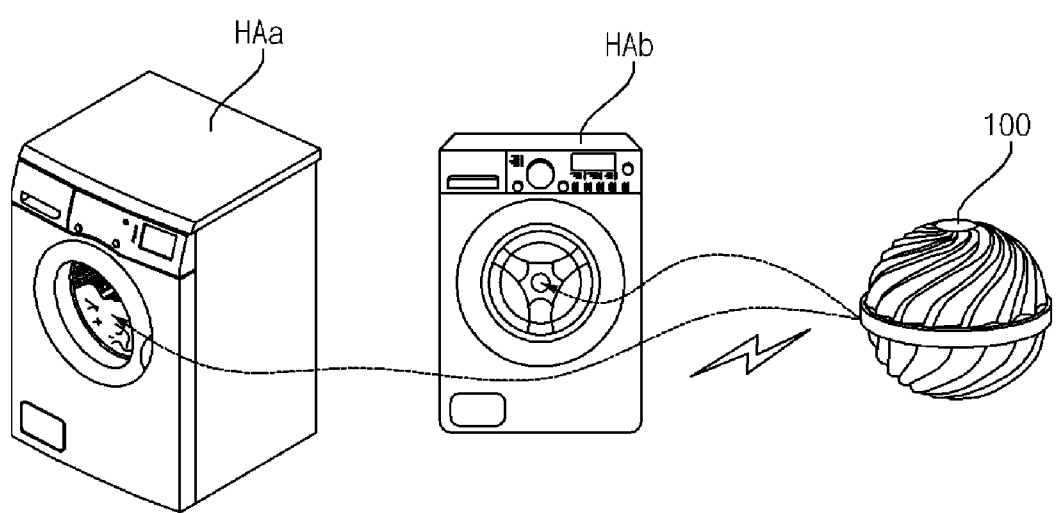
FIG. 9A is a diagram illustrating a sensor ball being input into a washing machine or dryer.

FIG. 9A is a diagram illustrating the sensor ball being input into the washing machine or the dryer.

Referring to the drawing, the sensor ball 100 may be put into a laundry tub in the washing machine HAa or the dryer HAb.

For example, in case in which the sensor ball 100 is input into the washing machine HAa, the processor 170 may detect the type of laundry based on the spectrometric sensor data sensed by the spectrometric sensor LSa and output a washing method control signal or an automatic temperature control signal according to the type of laundry. Additionally, the washing method control signal or automatic temperature control signal may be transmitted to the washing machine HAa through the communication module 130.

As another example, the processor 170 may detect the turbidity of laundry based on turbidity sensor data sensed by the turbidity sensor TSa and output a rinse course change control signal or automatic operation control signal according to the turbidity of the laundry. Additionally, the rinse course change control signal or the automatic operation control signal may be transmitted to the washing machine HAa through the communication module 130.

As another example, the processor 170 may detect the temperature of laundry or wash water based on temperature sensor data sensed by a temperature sensor (not illustrated), and output fabric damage information or an automatic temperature control signal based on the difference between the temperature of the laundry or wash water and the set temperature. Additionally, the fabric damage information or automatic temperature control signal may be transmitted to the washing machine HAa through the communication module 130.

As another example, the processor 170 may determine laundry tangles based on acceleration sensor data and angular velocity sensor data sensed from the acceleration sensor AS and gyro sensor GS, and perform control to transmit the determined laundry tangle information to the washing machine HAa. Accordingly, it is possible to accurately determine the laundry tangles through the sensor ball 100 and transmit related information to the washing machine HAa.

Alternatively, the processor 170 may determine the laundry tangles based on the acceleration sensor data and angular velocity sensor data sensed from the acceleration sensor AS and gyro sensor GS, and perform control to transmit the motor pattern control notification or motor pattern control signal according to the laundry tangles to the washing machine HAa. Accordingly, it is possible to quickly the laundry tangles.

As another example, the processor 170 may determine the laundry tangles based on the sound collected by the microphone 135 and perform control to transmit the motor pattern control notification or the motor pattern control signal according to the laundry tangle information or the laundry tangles to a washing machine HAa. Accordingly, it is possible to quickly detangle laundry.

As another example, the processor 170 may detect a drying state of the laundry based on humidity sensor data sensed by the humidity sensor HSa and output a drying time control signal or an automatic operation control signal. Additionally, the drying time control signal or the automatic operation control signal may be transmitted to the washing machine HAa through the communication module 130.

Figure 9B:
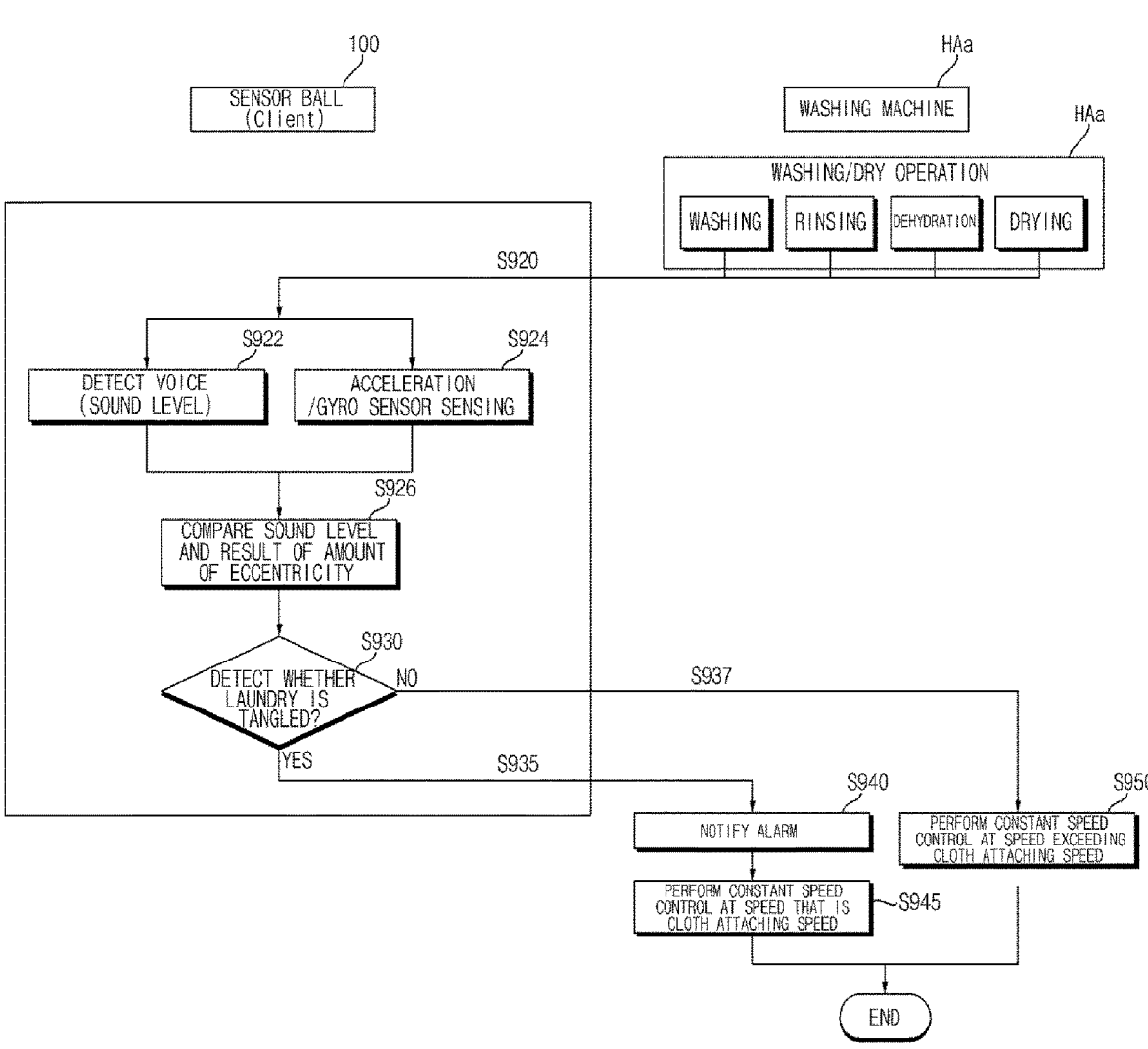
FIG. 9B is a flowchart illustrating a method of operating the sensor ball and the washing machine in case in which the sensor ball is input into the washing machine.

FIG. 9B is a flowchart illustrating a method of operating the sensor ball and the washing machine in case in which the sensor ball is input into the washing machine.

Referring to the drawing, the washing machine HAa can perform a washing cycle, a rinsing cycle, a dehydration cycle, or a drying cycle.

In case in which the washing machine HAa is operated in the washing cycle, the rinsing cycle, the dehydration cycle, or the drying cycle, operation information may be transmitted to the sensor ball 100 (S910).

During the washing cycle, rinsing cycle, dehydration cycle, or drying cycle, the laundry inside the washing machine HAa may become tangled. To detect this, the microphone 135 of the sensor ball 100 detects the sound inside the laundry tub washing machine (S922).

Meanwhile, the acceleration sensor AS and gyro sensor GS of the sensor ball 100 sense the acceleration sensor data and angular velocity sensor data, respectively (S924).

Meanwhile, the processor 170 within the sensor ball 100 may detect the amount of eccentricity of the laundry tub based on acceleration sensor data and angular velocity sensor data.

Meanwhile, the processor 170 in the sensor ball 100 compares the level of sound inside the laundry tub and the amount of eccentricity of the laundry tub (S926).

Then, the processor 170 in the sensor ball 100 detects whether the laundry is tangled based on the level of sound inside the laundry tub and the amount of eccentricity of the laundry tub (S930).

Meanwhile, in case in which laundry is detected as entangled, the laundry in the laundry tub is not evenly distributed, causing severe vibration in case in which the laundry tub is rotated.

Accordingly, in case in which laundry tangles are detected, the processor 170 in the sensor ball 100 may be configured to transmit the laundry tangle information to the washing machine HAa (S935).

Accordingly, the laundry tub HAa may display a notification related to eccentricity on the display (not illustrated) (S940), or perform constant speed control at a speed (for example, 80 rpm) that is a cloth attaching speed (for example, 108 rpm) or less in the laundry tub HAa (S945). Accordingly, vibration during rotation of the laundry tub can be reduced.

Meanwhile, in case in which the laundry tangles are not detected, the processor 170 in the sensor ball 100 may be configured to transmit the laundry distribution information to the laundry tub HAa (S937).

Accordingly, the laundry tub HAa may perform constant speed control at a speed (for example, 120 rpm) that exceeds the cloth attaching speed (for example, 108 rpm) in the laundry tub HAa (S950). Accordingly, a smooth washing operation can be performed.

FIGS. 10A to 10F are diagrams referenced to explain operations in case in which the sensor ball is input into various home appliances.

Figure 10A:
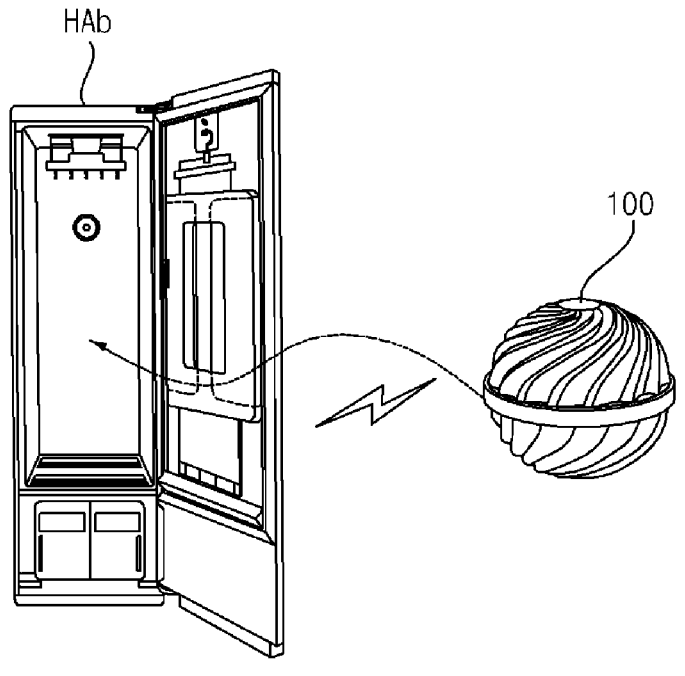
FIGS. 10A to 10F are diagrams referenced to explain operations in case in which a sensor ball is input into various home appliances.

First, FIG. 10A illustrates that the sensor ball 100 is input into the clothing manager HAh.

For example, in case in which the sensor ball 100 is input into the clothing manager HAh, the processor 170 may detect bacteria or viruses based on biosensor data sensed by the biosensor BIb, and output a clothing hygiene sterilization mode control signal or an intensity automatic control signal depending on the detected bacteria or virus. In addition, the clothing hygiene sterilization mode control signal or the intensity automatic control signal may be transmitted to the clothing manager HAh through the communication module 130.

As another example, in case in which the sensor ball 100 is input into the clothing manager HAh, the processor 170 may detect the type of cloth based on the spectrometric sensor data sensed by the spectrometric sensor LSb and output a clothing function mode automatic control signal depending on the type of the cloth. In addition, the clothing function mode automatic control signal may be transmitted to the clothing manager HAh through the communication module 130.

As another example, the processor 170 may detect a clothing cleaning operating temperature based on temperature sensor data sensed by a temperature sensor (not illustrated) and output an automatic temperature control signal based on a difference between the clothing cleaning operating temperature and a set temperature. Moreover, the automatic temperature control signal may be transmitted to the clothing manager HAh through the communication module 130.

As another example, the processor 170 may detect the clothing moving hanger operation based on acceleration sensor data and angular velocity sensor data sensed from the acceleration sensor AS and gyro sensor GS, and perform control to transmit an automatic moving pattern control signal depending on the clothing moving hanger operation to t the clothing manager Hah.

As another example, the processor 170 may perform voice recognition based on the sound collected by the microphone 135 and control to transmit an operation control signal according to the voice recognition to the clothing manager HAh.

As another example, the processor 170 may detect a humidity state of clothing based on humidity sensor data sensed by the humidity sensor HSb, and output a drying time control signal or a dehumidifying automatic control signal based on the humidity state of the clothing. In addition, the drying time control signal or the dehumidifying automatic control signal may be transmitted to the clothing manager HAh through the communication module 130.

As another example, the processor 170 detects the dust generation state based on dust sensor data sensed by a dust sensor PMb, and output a customized clean operation control signal or an automatic time addition control signal based on the dust generation state. In addition, the customized cleanliness operation control signal or the automatic time addition control signal may be transmitted to the clothing manager HAh through the communication module 130.

Figure 10B:
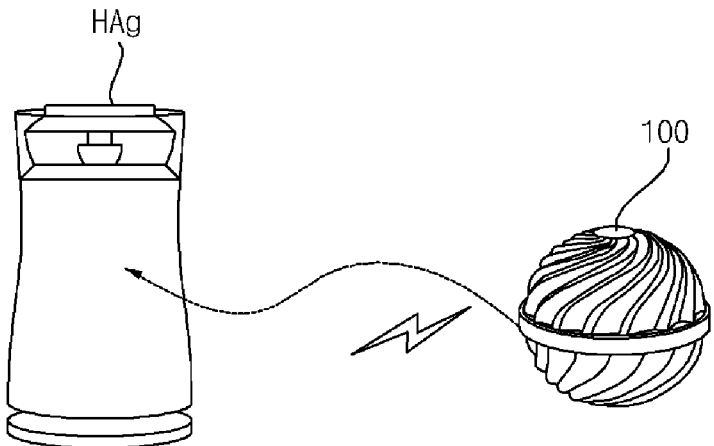

Next, FIG. 10B illustrates that the sensor ball 100 is located near the air purifier HAg.

For example, in case in which the sensor ball 100 is input into the air purifier HAg, the processor 170 may detect bacteria or viruses based on biosensor data sensed by the biosensor BIb, and output a sanitary sterilization mode control signal or an intensity automatic control signal depending on the detected bacteria or virus. In addition, the sanitary sterilization mode control signal or the intensity automatic control signal may be transmitted to the air purifier HAg through the communication module 130.

As another example, the processor 170 may detect the air quality state based on gas sensor data sensed by the gas sensor GSb, and output a customized cleaning operation control signal, a circulation fan intensity control signal, or a rotation automatic operation control signal based on the air quality state. In addition, the customized cleaning operation control signal, circulation fan intensity control signal, or rotation automatic operation control signal may be transmitted to the air purifier HAg through the communication module 130. As another example, the processor 170 may detect the size or concentration of dust particles based on dust sensor data sensed by a dust sensor PMb, and output a customized cleaning operation control signal, a circulation fan intensity control signal, or a rotation automatic operation control signal based on the size or concentration of dust particles. In addition, customized cleaning operation control signal, the circulation fan intensity control signal, or the rotation automatic operation control signal may be transmitted to the air purifier HAg through the communication module 130.

As another example, the processor 170 may perform voice recognition based on the sound collected by the microphone 135 and control to transmit an operation control signal depending on the voice recognition to an air purifier HAg.

Figure 10C:
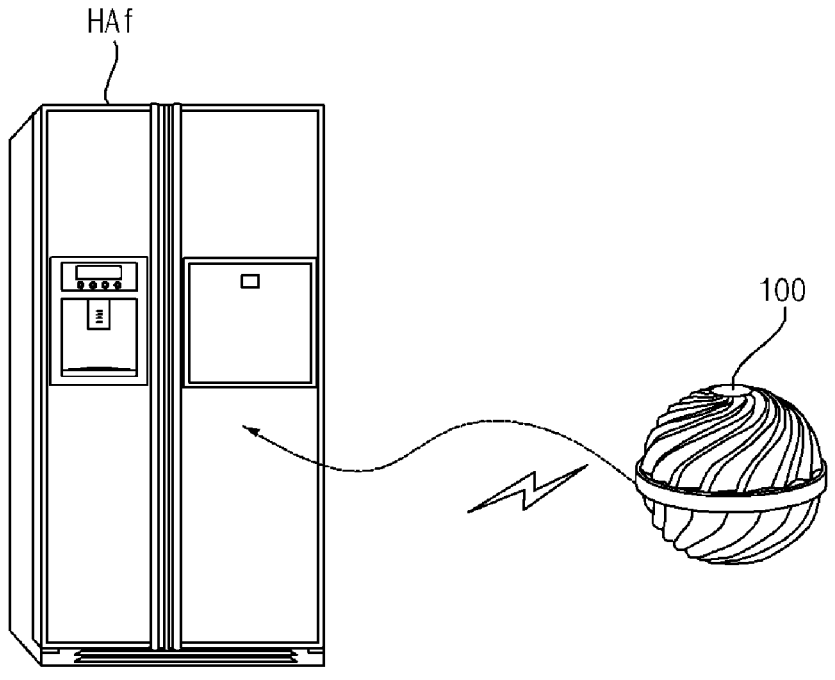

Next, FIG. 10C illustrates that the sensor ball 100 is put into the refrigerator HAf.

For example, in case in which the sensor ball 100 is input into the refrigerator HAf, the processor 170 may detect bacteria or viruses based on biosensor data sensed by the biosensor BIb, and output a spoiled food material notification signal, a food material hygiene sterilization mode control signal, or an intensity automatic control signal depending on the detected bacteria or virus. In addition, the spoiled food material notification signal, food material hygiene automatic sterilization mode control signal, or intensity control signal may be transmitted to the refrigerator HAf through the communication module 130.

As another example, in case in which the sensor ball 100 is input into the refrigerator HAf, the processor 170 may detect food material spoilage based on gas sensor data sensed by the gas sensor GSb and output a spoiled food material notification signal or a refrigeration intensity automatic control signal based on the spoilage of the food material. In addition, the spoiled food material notification signal or the automatic refrigeration intensity control signal may be transmitted to the refrigerator HAf through the communication module 130.

As another example, the processor 170 may detect an internal temperature of the refrigerator HAf based on temperature sensor data sensed by a temperature sensor (not illustrated) and output an automatic temperature control signal based on the difference between the internal temperature and the set temperature. Moreover, the automatic temperature control signal may be transmitted to the refrigerator HAf through the communication module 130.

As another example, the processor 170 may perform voice recognition based on the sound collected by the microphone 135 and control to transmit an operation control signal according to the voice recognition to the refrigerator HAf.

As another example, the processor 170 may detect the humidity state inside the refrigerator HAf based on humidity sensor data sensed by the humidity sensor HSb, and output a customized refrigeration intensity automatic control signal based on the humidity state inside the refrigerator HAf. Moreover, the customized refrigeration intensity automatic control signal may be transmitted to the refrigerator HAf through the communication module 130.

Figure 10D:
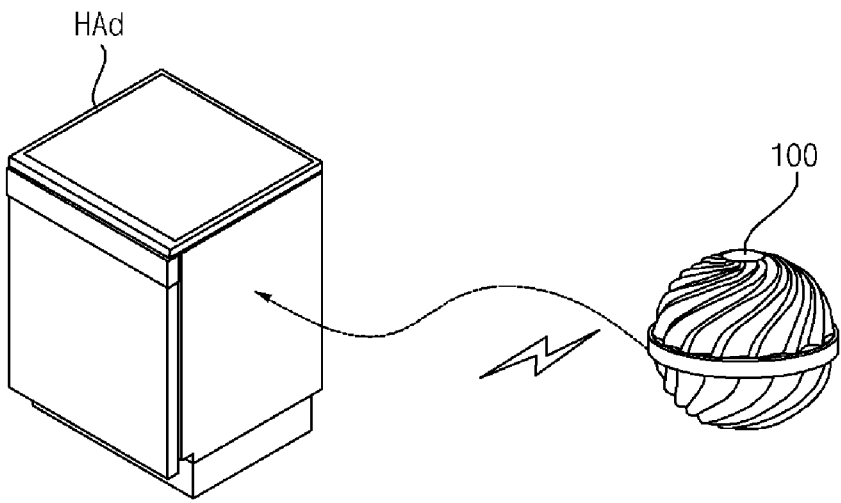

Next, FIG. 10D illustrates that the sensor ball 100 is input into the dishwasher HAd.

For example, in case in which the sensor ball 100 is input into a dishwasher HAd, the processor 170 may detect bacteria or viruses based on biosensor data sensed by a biosensor (not illustrated), and output a washing intensity automatic control signal or a rinsing intensity automatic control signal depending on the detected bacteria or virus. Moreover, the washing intensity automatic control signal or the rinsing intensity automatic control signal may be transmitted to the dishwasher HAd through the communication module 130.

As another example, in case in which the sensor ball 100 is input into the dishwasher HAd, the processor 170 may detect the type of dishwasher based on the spectrometric sensor data sensed by the spectrometric sensor LSa and output a washing method control signal or an automatic temperature control signal depending on the type of tableware. In addition, the washing method control signal or automatic temperature control signal may be transmitted to the dishwasher HAd through the communication module 130.

As another example, the processor 170 may detect the turbidity of the washing water based on the turbidity sensor data sensed by the turbidity sensor TSa and output a rinsing number setting control signal or an automatic operation control signal depending on the turbidity of the washing water. In addition, the rinsing number setting control signal or the automatic operation control signal may be transmitted to the dishwasher HAd through the communication module 130.

As another example, the processor 170 may detect the temperature of the washing water or wash water based on temperature sensor data sensed by a temperature sensor (not illustrated), and output a steam temperature control signal or an automatic temperature control signal according to a difference between the temperature of the washing water or wash water and the set temperature. Moreover, the steam temperature control signal or automatic temperature control signal may be transmitted to the dishwasher HAd through the communication module 130.

As another example, the processor 170 may recognize noise due to washing instability based on the sound collected by the microphone 135, and perform control to transmit a motor pattern control notification or a motor pattern control signal according to the noise to the dishwasher HAd.

Alternatively, the processor 170 may perform voice recognition based on the sound collected by the microphone 135 and control to transmit an operation control signal according to the voice recognition to the dishwasher HAd.

As another example, the processor 170 may detect the drying state of the washing material based on humidity sensor data sensed by a humidity sensor HSa and output a drying time control signal or an automatic operation control signal. Moreover, the drying time control signal or the automatic operation control signal may be transmitted to the dishwasher HAd through the communication module 130.

Figure 10E:
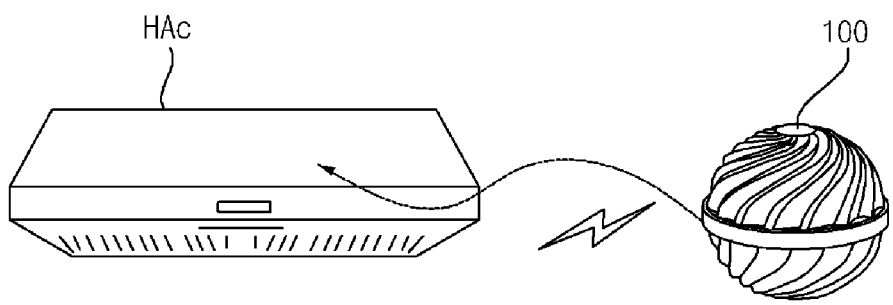

Next, FIG. 10E illustrates that the sensor ball 100 is located near the hood Hac.

For example, in case in which the sensor ball 100 is input into the hood Hac, the processor 170 may detect a gas leak or cooking state based on the biosensor data sensed by the biosensor BIb or the gas sensor data sensed by the gas sensor GSb, can be detected, and output a gas leak notification or cooking overheating notification depending on the detected gas leak or cooking state. In addition, the gas leak notification or cooking overheating notification may be transmitted to the hood Hac through the communication module 130.

As another example, the processor 170 may detect the ambient temperature based on temperature sensor data sensed by a temperature sensor (not illustrated) and output an ignition risk notification based on the ambient temperature. Moreover, the ignition risk notification may be delivered to the hood Hac through the communication module 130.

As another example, the processor 170 may perform voice recognition based on the sound collected by the microphone 135 and control to transmit an operation control signal according to the voice recognition to the hood Hac.

Figure 10F:
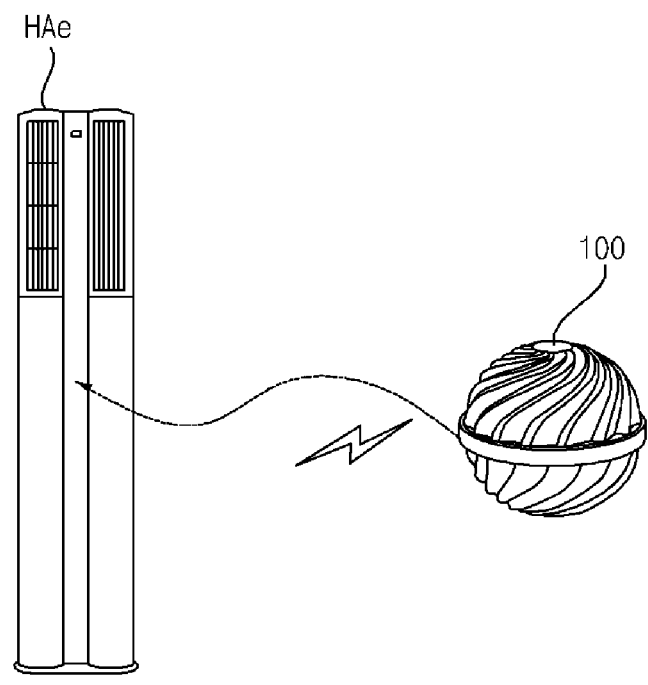

Next, FIG. 10F illustrates that the sensor ball 100 is located near the air conditioner HAe.

For example, in case in which the sensor ball 100 is input into the air conditioner HAe, the processor 170 may detect bacteria or viruses based on biosensor data sensed by the biosensor BIb, and output an air quality hygiene sterilization mode control signal or intensity automatic control signal according to the detected bacteria or viruses. In addition, the air quality hygiene sterilization mode control signal or the intensity automatic control signal may be transmitted to the air conditioner HAe through the communication module 130.

As another example, in case in which the sensor ball 100 is input into the air conditioner HAe, the processor 170 may detects air quality based on gas sensor data sensed by the gas sensor GSb, and output a customized clean ventilation control signal, a customized air volume control signal, or a rotation automatic operation control signal according to the detected air quality. In addition, the customized clean ventilation control signal, customized air volume control signal, or automatic rotation control signal may be transmitted to the air conditioner HAe through the communication module 130.

As another example, the processor 170 may detect dust particle size or concentration based on dust sensor data sensed by a dust sensor PMb, and output a customized clean ventilation control signal, a customized air volume control signal, or a rotation automatic operation control signal based on the dust particle size or concentration. In addition, the customized clean ventilation control signal, customized air volume control signal, or rotation automatic control signal may be transmitted to the air conditioner HAe through the communication module 130.

As another example, the processor 170 may perform voice recognition based on the sound collected by the microphone 135 and control to transmit an operation control signal according to the voice recognition to the air conditioner HAe.

As another example, the processor 170 may detect the indoor temperature based on temperature sensor data sensed by a temperature sensor (not illustrated) and output an automatic temperature control signal based on the difference between the indoor temperature and the set temperature. Moreover, the automatic temperature control signal may be transmitted to the air conditioner HAe through the communication module 130.

As another example, the processor 170 may detect the indoor humidity state based on humidity sensor data sensed by a humidity sensor HSb, and outputs a dehumidification time control signal or an automatic operation control signal based on the indoor humidity state. In addition, the dehumidification time control signal or the automatic operation control signal may be transmitted to the air conditioner HAe through the communication module 130.

Meanwhile, although the preferred embodiments of the present disclosure have been illustrated and described above, the present disclosure is not limited to the specific embodiments described above. Of course, various modifications can be made by a person with ordinary knowledge in the technical field to which the invention pertains without departing from the gist of the present disclosure as claimed in claims, and these modified implementations should not be understood individually from the technical ideas or perspectives of the present disclosure.

What is claimed is:

1. A sensor ball comprising:
a case having at least one curved surfaces;
a first board disposed within the case and on which a processor is disposed; and
a second board electrically connected to the first board and on which a plurality of sensors are disposed,
wherein a first group of the plurality of sensors is disposed on an outer surface of the case or an end of the second board, and a second group of the plurality of sensors protrudes from the outer surface of the case or the end of the second board,
wherein the first board further includes a communication module configured to perform wireless communication with a home appliance,
wherein the communication module is further configured to perform pairing with the home appliance based on strength of a received radio frequency signal, and transmit sensor data sensed by the plurality of sensors to the paired home appliance, and
wherein the communication module is further configured to:
when the paired home appliance is a washing machine, transmit sensor data sensed from a spectrometric sensor, a turbidity sensor, an acceleration sensor, and a gyro sensor to the washing machine,
when the paired home appliance is a dryer, transmit the sensor data sensed from the spectrometric sensor, the turbidity sensor, the acceleration sensor, the gyro sensor, and a humidity sensor to the dryer, and
when the paired home appliance is a dishwasher, transmit the sensor data sensed from the spectrometric sensor, the turbidity sensor, and the humidity sensor to the dishwasher.

2. The sensor ball of claim 1, wherein the first group of the plurality of sensors include the spectrometric sensor, the acceleration sensor, and the gyro sensor, and
the second group of the plurality of sensors includes the turbidity sensor and the humidity sensor.

3. The sensor ball of claim 2, wherein the second group of the plurality of sensors further includes a biosensor.

4. The sensor ball of claim 1, wherein the second group of the plurality of sensors includes the turbidity sensor and the humidity sensor, and wherein the turbidity sensor protrudes farther than the humidity sensor based on the outer surface of the case or one end portion of the second board.

5. The sensor ball of claim 1, wherein the second board is detached from or attached to a groove in the case.

6. The sensor ball of claim 5, wherein when the second board is attached to the groove in the case, a connector formed in another end of the second board is electrically connected to a connector of the first board by a spring formed in the groove in the case.

7. The sensor ball of claim 1, further comprising a third board configured to electrically connect to the first board, the third board including another plurality of sensors disposed thereon, wherein the second board is configured to detach from a groove in the case and the third board is configured to attach in place of the second board.

8. The sensor ball of claim 7, wherein the third board protrudes farther out of the case than the second board.

9. The sensor ball of claim 7, wherein the third board is configured to have a greater number of sensors than the second board.

10. The sensor ball of claim 7, wherein a width of a connector of the second board and a width of a connector of the third board are the same, and a size of an area where the plurality of sensors are disposed on the third board is larger than a size of an area where the plurality of sensors are disposed on the second board.

11. The sensor ball of claim 7, wherein the plurality of sensors disposed on the third board protrude from the outer surface of the case.

12. The sensor ball of claim 7, wherein the plurality of sensors disposed on the third board includes a spectrometric sensor, an acceleration sensor, a gyro sensor, a dust sensor, a gas sensor, and a humidity sensor.

13. The sensor ball of claim 12, wherein the plurality of sensors disposed on the third board further include a bio-sensor.

14. The sensor ball of claim 1, wherein the communication module is further configured to pair with a plurality of home appliances, and transmits sensor data for each of the plurality of home appliances.

15. A sensor ball comprising:

a case having at least one curved surface;

a first board disposed within the case and on which a processor is disposed; and a second board electrically connected to the first board and on which a plurality of sensors are disposed, wherein a first group of the plurality of sensors are disposed on an outer surface of the case or an end of the second board, and a second group of the plurality of sensors protrude from the outer surface of the case or the end of the second board, and wherein in a state where the processor is paired with a washing machine, the processor is configured to determine laundry tangles based on sensor data sensed by an acceleration sensor and a gyro sensor, and transmit determined laundry tangle information to the washing machine.

16. A sensor ball comprising:

a case having at least one curved surface;

a first board disposed within the case and on which a processor is disposed; and a second board electrically connected to the first board and on which a plurality of sensors are disposed, wherein a first group of the plurality of sensors is disposed on an outer surface of the case or an end of the second board, and a second group of the plurality of sensors protrude from the outer surface of the case or the end of the second board, wherein the sensor ball further comprises a third board attached in place of the second board and electrically connected to the first board and in which a plurality of sensors are disposed, when the second board is detached from a groove in the case, wherein the first board further includes a communication module configured to perform paring and wireless communication with a home appliance, and wherein the communication module is further configured to:

when the paired home appliance is a clothing manager, transmit sensor data sensed from a spectrometric sensor, an acceleration sensor, a gyro sensor, a humidity sensor, and a dust sensor to the clothing manager, when the paired home appliance is an air purifier, transmit sensor data sensed from a gas sensor and the dust sensor to the air purifier, and when the paired home appliance is a refrigerator, the sensor data sensed from the gas sensor and the humidity sensor to the refrigerator.

\* \* \* \* \*